US012568711B2

(12) United States Patent
Zhang et al.

(10) Patent No.: US 12,568,711 B2
(45) Date of Patent: Mar. 3, 2026

(54) BACK-CONTACT SOLAR CELL AND PREPARATION METHOD THEREFOR

(71) Applicant: LONGI GREEN ENERGY TECHNOLOGY CO., LTD., Xi'an (CN)

(72) Inventors: Dongwei Zhang, Xi'an (CN); Shuai Wu, Xi'an (CN); Yunpeng Li, Xi'an (CN); Feng Ye, Xi'an (CN); Liang Fang, Xi'an (CN); Xixiang Xu, Xi'an (CN)

(73) Assignee: LONGi Green Energy Technology Co., Ltd., Xi'an (CN)

( * ) Notice: Subject to any disclaimer, the term of this patent is extended or adjusted under 35 U.S.C. 154(b) by 0 days.

(21) Appl. No.: 19/107,170

(22) PCT Filed: Jul. 14, 2023

(86) PCT No.: PCT/CN2023/107550
§ 371 (c)(1),
(2) Date: Feb. 27, 2025

(87) PCT Pub. No.: WO2024/045917
PCT Pub. Date: Mar. 7, 2024

(65) Prior Publication Data
US 2026/0006940 A1 Jan. 1, 2026

(30) Foreign Application Priority Data

| Aug. 31, 2022 | (CN) | .......................... 202211056084.1 |
| Aug. 31, 2022 | (CN) | .......................... 202211062923.0 |

(51) Int. Cl.
| *H10F 77/14* | (2025.01) |
| *H10F 10/174* | (2025.01) |
| *H10F 71/00* | (2025.01) |

(52) U.S. Cl.
CPC ......... *H10F 77/147* (2025.01); *H10F 10/174* (2025.01); *H10F 71/1221* (2025.01)

(58) Field of Classification Search
None
See application file for complete search history.

(56) References Cited

U.S. PATENT DOCUMENTS

| 9,634,177 B2 | 4/2017 | Rim et al. |
| 2016/0043267 A1* | 2/2016 | Rim ...................... H10F 71/103 438/71 |

(Continued)

FOREIGN PATENT DOCUMENTS

| CN | 102625955 A | 8/2012 |
| CN | 105794004 A | 7/2016 |

(Continued)

OTHER PUBLICATIONS

Office Action and Search Report in Chinese Appln. No. 202211056084.1, dated Apr. 30. 2024, 22 pages (with English translation).

(Continued)

*Primary Examiner* — Daniel P Malley, Jr.
(74) *Attorney, Agent, or Firm* — Fish & Richardson P.C.

(57) ABSTRACT

The present application discloses a back-contact solar cell and a preparation method thereof. The back-contact solar cell includes: a semiconductor substrate; a tunnel oxide layer and a doped crystalline silicon layer, where the tunnel oxide layer is located in a first region, and the doped crystalline silicon layer is located on a surface of the tunnel oxide layer away from the semiconductor substrate; an intrinsic non-crystalline silicon layer and a doped non-crystalline silicon layer where the intrinsic non-crystalline silicon layer is located in a second region and extends on part of a surface of the doped crystalline silicon layer away from the tunnel oxide layer, and the doped non-crystalline silicon layer is located on a surface of the intrinsic non-crystalline silicon (Continued)

layer away from the semiconductor substrate; and an isolating structure including an isolating layer and an isolating groove.

18 Claims, 7 Drawing Sheets

(56) References Cited

U.S. PATENT DOCUMENTS

| | | |
|---|---|---|
| 2016/0284896 A1 | 9/2016 | Westerberg et al. |
| 2017/0077322 A1 | 3/2017 | Westerberg et al. |
| 2020/0098939 A1 | 3/2020 | Nakai et al. |
| 2024/0347660 A1 | 10/2024 | Li et al. |
| 2024/0372016 A1 | 11/2024 | Westerberg et al. |

FOREIGN PATENT DOCUMENTS

| | | |
|---|---|---|
| CN | 106784069 A | 5/2017 |
| CN | 106252457 B | 10/2018 |
| CN | 108711579 A | 10/2018 |
| CN | 110634971 A | 12/2019 |
| CN | 110690308 A | 1/2020 |
| CN | 110838536 A | 2/2020 |
| CN | 110957391 A | 4/2020 |
| CN | 109216509 B | 2/2021 |
| CN | 112490324 A | 3/2021 |
| CN | 113322008 A | 8/2021 |
| CN | 113809186 A | 12/2021 |
| CN | 113809202 A | 12/2021 |
| CN | 114038922 A | 2/2022 |
| CN | 114068731 A | 2/2022 |
| CN | 216084904 U | 3/2022 |
| CN | 114497290 A | 5/2022 |
| CN | 216488083 U | 5/2022 |
| CN | 114774004 A | 7/2022 |
| CN | 114823967 A | 7/2022 |
| CN | 217086578 U | 7/2022 |
| CN | 115513307 A | 12/2022 |
| CN | 115513308 A | 12/2022 |
| CN | 115513309 A | 12/2022 |
| JP | 2020-053537 A | 4/2020 |
| TW | 201705504 A | 2/2017 |
| WO | WO 2016147970 A1 | 9/2016 |
| WO | 2016/160378 A1 | 10/2016 |

OTHER PUBLICATIONS

Office Action and Search Report in Chinese Appln. No. 202211056084. 1, dated Nov. 25, 2024, 22 pages (with English translation).
Office Action and Search Report in Chinese Appln. No. 202211056084. 1, dated Sep. 3, 2024, 20 pages (with English translation).
Office Action and Search Report in Chinese Appln. No. 202211062923. 0, dated May 7, 2024, 23 pages (with English translation).
Office Action in Chinese Appln. No. 202211062923.0, dated Nov. 25, 2024, 22 pages (with English translation).
Office Action in Chinese Appln. No. 202211062923.0, dated Sep. 3, 2024, 25 pages (with English translation).
International Search Report and Written Opinion in International Appln. No. PCT/CN2023/107550, mailed on Oct. 16, 2023, 13 pages (with English translation).
Extended European Search Report in European Appln. No. 23858954. 3, mailed on Nov. 13, 2025, 11 pages.

* cited by examiner

BACK-CONTACT SOLAR CELL AND PREPARATION METHOD THEREFOR

CROSS-REFERENCE TO RELATED APPLICATIONS

This application is a 371 national stage application of PCT Application No. PCT/CN2023/107550, filed on Jul. 14, 2023, which claims priority to Chinese Patent Application Nos. 202211056084.1 and 202211062923.0, both filed on Aug. 31, 2022. The disclosures of the aforementioned applications are hereby incorporated by reference in their entireties.

TECHNICAL FIELD

The present application relates to the technical field of solar cells, and specifically to a back-contact solar cell and a preparation method thereof.

BACKGROUND

In recent years, with the continuous development of photovoltaic related technologies, the efficiency for mass production of solar cells by many manufacturers is continuously improved. PERC solar cells are a main product available and still occupy a considerable proportion in the current market. However, the efficiency for mass production approaches a theoretical limit of 24.5%. According to a rule that the conversion efficiency of crystalline silicon solar cells is improved by 0.5 percentage point every year, the conversion efficiency of crystalline silicon solar cells will reach an industrialization limit of 27.5% by 2030, which is close to a theoretical limit of 29.43% for single-junction crystalline silicon solar cells. Thus, a development era of crystalline silicon tandem solar cells comes. As representatives of high-efficiency solar cells, tunnel oxide passivated contact (TOPCON) solar cells, hetero-junction with intrinsic thin-layer (HIT) solar cells, and interdigitated back contact (IBC) solar cell, i.e. three N-type technical routes, have very high theoretical efficiencies.

At present, the attention in the industry is mainly focused on the passivated contact technology routes TOPCON and HJT. The logic of evolution of high-efficiency crystalline silicon solar cell technology is to reduce the recombination of carriers in the solar cells with a lower-cost large-scale process, thereby improving the open-circuit voltage and conversion efficiency. PERC solar cells are advantageous over BSF aluminum back-field solar cells. The key is to implement a better passivation technology on a back surface of the solar cells, which enhances the internal back reflection of light, and reduces the back recombination. As indicated by the laboratory and industrialization results, the passivated contact technologies of TOPCON and HJT solar cells can greatly reduce the contact recombination between a metal electrode and bulk silicon, thereby achieving a higher conversion efficiency than PERC solar cells. In terms of the mass production cost, the TOPCON solar cell technology compatible with the PERC production line is one step ahead of HJT.

The IBC solar cell technology, as the oldest crystalline silicon solar cell technology, is famous, has an independent system, and occupies the first place on the record list for conversion efficiency of crystalline silicon solar cells for a long time. However, it persistently has the limitation of high mass production cost and developed frustratedly. IBC solar cells are greatly different from other crystalline silicon solar cells in that the emitter, surface field and metal electrodes are provided on the back surface of the solar cell, and distributed interdigitatedly, the front surface of the solar cell is not shielded by any grid lines, and the light absorption area is the largest.

IBC solar cell technology has been developed for decades, and receives more and more attention. IBC solar cells not only have a solar cell structure with the potential of highest conversion efficiency, but also can continuously absorb the technological advantages of other crystalline silicon technical routes, to constantly improve the conversion efficiency. IBC combines the advantages of PERC technology, alumina passivation technology and local contact, to improve the conversion efficiency to 24%-25%; combines the TOPCON passivation contact technology and is developed into a tunnel oxide back contact (TBC) solar cell, to improve the conversion efficiency to 25%-26%; and combines the amorphous silicon passivation technology of HJT and is developed into a hetero-junction back contact (HBC) solar cell, to improve the conversion efficiency to 26%-27%.

Compared with IBC solar cells. HBC solar cells use a-Si:H as a double-sided passivation layer, thus having excellent passivation effect and higher open-circuit voltage. Compared with IBC, HBC is a passivated contact technology, in which non-crystalline silicon provides excellent interface passivation, and the passivated contact prevents serious metal recombination. Compared with HJT solar cells, the front surface is not shielded by electrodes, and the advantage of reducing optical loss is more obvious. By combining the two advantages of the front surface. HBC solar cells can have a higher short-circuit current.

The ultimate goal of the research and development of new solar cell technologies is to realize mass production. The cost determines whether the mass production can be implemented. At present, N-type solar cells face many problems to be solved in the manufacturing, apparatus, and other aspects. The current yield of TOPCON solar cell still needs to be further improved, the difference from PERC non-silicon cost is 2 times of the difference from silicon cost, and the high temperature process needs to be further improved to match the process for silicon wafer. There is little difference between the yield of HJT solar cells and PERC. However, the cost of silver paste is about twice that of PERC. The non-silicon cost needs to be solved urgently. Meanwhile, the apparatus is domesticated and needs for further replacement. HBC solar cells have the advantages of both IBC and HJT, and retain the difficulties in their respective production processes: 1) expensive apparatus, long process, and high investment cost; 2) narrow process window and extremely high requirement for process cleanliness in the intrinsic and doped amorphous silicon coating process; 3) the requirement for strict control on the damage of laser to n and p regions, in the manufacturing process, and narrow process window particularly for n region, thus increasing the technical difficulty. These aspects restrict the efficiency improvement and cost reduction of HBC solar cells, and limits its industrial application.

SUMMARY

The present application aims to solve one of the technical problems in related art at least to some extent. To this end, an object of the present application is to provide a back-contact solar cell and a preparation method thereof. In the present application, the process window for preparing the back-contact solar cell is broadened, the process difficulty is reduced, and the surface passivation effect of a doped region is improved. Therefore, the energy conversion efficiency Eta, the open-circuit voltage Uoc, and the filling factor FF of the solar cell reach levels comparable to those of a conventional HBC solar cell structure. Moreover, problems of large parasitic absorption by intrinsic non-crystalline silicon and large reflectivity of a light receiving surface in the conventional HBC are solved, and the short-circuit current of the solar cell is improved.

In an aspect of the present application, the present application provides a back-contact solar cell. According to an embodiment of the present disclosure, the back-contact solar cell includes:

a semiconductor substrate, where the semiconductor substrate has a first surface and a second surface opposite to each other, and the first surface includes adjacent first region and second region;

a tunnel oxide layer and a doped crystalline silicon layer, where the tunnel oxide layer is located in the first region, and the doped crystalline silicon layer is located on a surface of the tunnel oxide layer away from the semiconductor substrate;

a first intrinsic non-crystalline silicon layer and a doped non-crystalline silicon layer, where the doped crystalline silicon layer and the doped non-crystalline silicon layer have opposite conductivity types, the first intrinsic non-crystalline silicon layer is located in the second region and extends on part of a surface of the doped crystalline silicon layer away from the tunnel oxide layer, and the doped non-crystalline silicon layer is located on a surface of the first intrinsic non-crystalline silicon layer away from the semiconductor substrate, to form an staggered-lamination region of the first intrinsic non-crystalline silicon layer and the doped non-crystalline silicon layer with the tunnel oxide layer and the doped crystalline silicon layer; and an isolating structure, where the isolating structure includes an isolating layer and an isolating groove, in which the isolating layer is located between the first intrinsic non-crystalline silicon layer and the doped crystalline silicon layer in the staggered-lamination region; and the isolating groove penetrates through the doped non-crystalline silicon layer and the first intrinsic non-crystalline silicon layer in the staggered-lamination region.

In accordance with the back-contact solar cell according to the embodiment of the present application, compared with an HBC solar cell structure in related art, a tunnel oxide layer+doped crystalline silicon layer passivated contact is used in the present application to replace an intrinsic a-Si: H+a-Si:H(N) film in the existing HBC solar cell structure. Since the tunnel oxide layer+doped crystalline silicon layer is less sensitive to laser-induced thermal damage, the impact on the passivation effect of a doped region corresponding to the first region can be reduced during a laser cutting process, thus further broadening the process window, and reducing the process difficulty. Compared with a TBC solar cell structure in related art, a first intrinsic non-crystalline silicon layer i-a-Si+doped non-crystalline silicon layer passivated contact is used in the present disclosure to replace SiOx+ p-poly-Si in the existing TBC solar cell structure. By means of this, the problem of serious concentric circles on a silicon wafer due to two high-temperature processes of p poly and n poly in the TBC solar cells is avoided, to improve the surface passivation effect of a doped region corresponding to the second region, and improve the electrical performance of the solar cell. Therefore, the structure of the back-contact solar cell according to the present application broadens the process window for preparing the back-contact solar cell, reduces the process difficulty, and improves the surface passivation effect of the doped region. Therefore, the energy conversion efficiency Eta, the open-circuit voltage Uoc, and the filling factor FF of the solar cell reach levels comparable to those of an existing HBC solar cell structure. In addition, in the back-contact solar cell according to the present application, an oxide passivation layer+silicon nitride passivation layer is used to replace a front-side intrinsic a-Si: H+SiNx film in the conventional HBC, whereby the problems of large parasitic absorption by intrinsic non-crystalline silicon and large reflectivity of a light receiving surface in the conventional HBC are solved, and the short-circuit current of the solar cell is improved.

In addition, the back-contact solar cell according to the embodiment of the present application may further has the following additional technical features.

In some embodiments of the present application, the isolating groove needs to sequentially penetrate through an electrically conductive glass layer, the doped non-crystalline silicon layer, and the first intrinsic non-crystalline silicon layer in the staggered-lamination region.

In some embodiments of the present application, the first region has a texture structure; and/or, the second region has a texture structure; and/or, the second surface has a texture structure.

In some embodiments of the present application, the back-contact solar cell further includes: a first electrode layer and a second electrode layer. The first electrode layer is located at one side of the isolating groove, and the first electrode layer covers the doped non-crystalline silicon layer. The second electrode layer is located at the other side of the isolating groove, and the second electrode layer covers the doped non-crystalline silicon layer and the doped crystalline silicon layer.

In some embodiments of the present application, the staggered-lamination region includes a first staggered-lamination region and a second staggered-lamination region. The first electrode layer covers the doped non-crystalline silicon layer and the first staggered-lamination region. The second electrode layer covers the doped crystalline silicon layer and the second staggered-lamination region.

In some embodiments of the present application, the first electrode layer and the second electrode layer are transparent electrode layers. The materials of the first electrode layer and the second electrode layer are each independently at least one selected from indium-tin oxide, aluminum zinc oxide, hydrogen doped indium oxide, and indium-tungsten oxide.

In some embodiments of the present application, the materials of the first electrode layer and the second electrode layer are at least one selected from indium-tin oxide, aluminum zinc oxide, hydrogen doped indium oxide, and indium-tungsten oxide.

In some embodiments of the present application, the isolating layer includes an insulating layer, where the insulating layer is located between the first intrinsic non-crystalline silicon layer and the doped crystalline silicon layer; or the isolating layer includes an insulating layer and a doped oxide layer, where the doped oxide layer is located on the surface of the doped crystalline silicon layer away from the tunnel oxide layer, and the insulating layer is located on a surface of the doped oxide layer away from the doped crystalline silicon layer.

In some embodiments of the present application, the insulating layer has a thickness of 40 to 60 nm.

In some embodiments of the present application, the insulating layer is a silicon nitride layer.

In some embodiments of the present application, the back-contact solar cell further includes a passivation layer. The passivation layer includes an oxide passivation layer and a silicon nitride passivation layer. The oxide passivation layer is provided on the second surface, and the silicon nitride passivation layer is provided on a surface of the oxide passivation layer away from the semiconductor substrate.

In some embodiments of the present application, the oxide passivation layer has a thickness of 5 to 15 nm, and the silicon nitride passivation layer has a thickness of 70 to 110 nm.

In some embodiments of the present application, the doped non-crystalline silicon layer is a P-type doped non-crystalline silicon layer p-a-Si, and the doped crystalline silicon layer is an N-type doped crystalline silicon layer n-poly-Si. Alternatively, the doped non-crystalline silicon layer is an N-type doped non-crystalline silicon layer n-a-Si, and the doped crystalline silicon layer is a P-type doped crystalline silicon layer p-poly-Si.

In some embodiments of the present application, the texture structure is a pyramidal texture. An orthogonal projection of the pyramidal structure on a surface of the semiconductor substrate has a size of 1-3 $\mu$m in a width direction, and the pyramidal structure has a size of 1.5-2 $\mu$m in a thickness direction.

In some embodiments of the present application, the tunnel oxide layer is a tunnel $SiO_2$ layer; and/or, the tunnel oxide layer has a thickness of 1.2 to 1.8 nm; and/or, the doped crystalline silicon layer has a thickness of 80 to 200 nm; and/or, the doped crystalline silicon layer has a diffusion sheet resistance of 70 to 110 $\Omega$/sq; and/or, the doped oxide layer has a thickness of 25 to 35 nm; and/or, the first intrinsic non-crystalline silicon layer has a thickness of 5 to 30 nm; and/or, the doped non-crystalline silicon layer has a thickness of 10 to 30 nm; and/or, the concentration of doping element in the doped non-crystalline silicon layer is 10e20 cm−3 to 10e21 cm−3.

In another aspect of the present disclosure, the present application provides a method for preparing a back-contact solar cell. According to an embodiment of the present disclosure, the method includes the following steps:

providing a semiconductor substrate, where the semiconductor substrate has a first surface and a second surface opposite to each other, and the first surface includes adjacent first region and second region;

forming a tunnel oxide layer, a doped crystalline silicon layer, and an isolating layer sequentially on the first surface;

cutting the isolating layer in the second region by laser, to expose the second region and leave over the tunnel oxide layer and the doped crystalline silicon layer in the first region;

forming a first intrinsic non-crystalline silicon layer and a doped non-crystalline silicon layer sequentially on a surface of the prepared intermediate away from the second surface;

removing parts of the first intrinsic non-crystalline silicon layer, the doped non-crystalline silicon layer and the isolating layer at one end away from the second region, to leave over the first intrinsic non-crystalline silicon layer and the doped non-crystalline silicon layer staggered with the tunnel oxide layer and the doped crystalline silicon layer, and form an staggered-lamination region; and forming a groove in the staggered-lamination region, to divide the staggered-lamination region into a first staggered-lamination region and a second staggered-lamination region.

In the method according to the embodiment of the present application, a tunnel oxide layer+doped crystalline silicon layer passivated contact is used in the method to replace an intrinsic a-Si:H+a-Si:H(N) film in the existing HBC solar cell structure, compared with a process for preparing an HBC solar cell in related art. Since the tunnel oxide layer+doped crystalline silicon layer is less sensitive to laser-induced thermal damage, the impact on the passivation effect of a doped region corresponding to the first region can be reduced during a laser cutting process, thus further broadening the process window; and reducing the process difficulty. Compared with a process for preparing a TBC solar cell in related art, a first intrinsic non-crystalline silicon layer i-a-Si+doped non-crystalline silicon layer passivated contact is used in the method to replace SiOx+p-poly-Si in the existing TBC solar cell structure. By means of this, the problem of serious concentric circles on a silicon wafer due to two high-temperature processes of p poly and n poly in the TBC solar cells is avoided, to improve the surface passivation effect of a doped region corresponding to the second region, and improve the electrical performance of the solar cell. Therefore, the method broadens the process window for preparing the back-contact solar cell, reduces the process difficulty, and improves the surface passivation effect of the doped region. Therefore, the energy conversion efficiency Eta, the open-circuit voltage Uoc, and the filling factor FF of the solar cell reach levels comparable to those of an existing HBC solar cell structure. In addition, an oxide passivation layer+silicon nitride passivation layer is used in the method to replace a front-side intrinsic a-si:H+SiNx film in the conventional HBC, whereby the problems of large parasitic absorption by intrinsic non-crystalline silicon and large reflectivity of a light receiving surface in the conventional HBC are solved, and the short-circuit current of the solar cell is improved.

In addition, the method according to the embodiment of the present application may further have the following implementations.

In some embodiments of the present application, the method further includes the following steps: performing alkaline texturing on the semiconductor substrate after the second region is exposed, to form a pyramidal texture structure on the second surface and in the second region.

In some embodiments of the present application, after the pyramidal texture structure is formed on the second surface and in the second region, an oxide passivation layer and a silicon nitride passivation layer are sequentially formed on the second surface.

In some embodiments of the present application, after a groove is formed in the staggered-lamination region, a first electrode layer is formed at one side of the isolating groove, and the first electrode layer covers the doped non-crystalline silicon layer; and a second electrode layer is formed at the other side of the isolating groove, and the second electrode layer covers the doped non-crystalline silicon layer and the doped crystalline silicon layer.

In some embodiments of the present application, the first electrode layer covers the doped non-crystalline silicon layer and the staggered-lamination region, and the second electrode layer covers the doped crystalline silicon layer and the staggered-lamination region.

In some embodiments of the present application, a first grid line is formed on part of a surface of the first electrode layer, and a second grid line is formed on part of a surface of the second electrode layer.

In some embodiments of the present application, the tunnel oxide layer and the doped crystalline silicon layer are deposited by LPCVD.

In some embodiments of the present application, the isolating layer includes an insulating layer; or the isolating layer includes an insulating layer and a doped oxide layer, where the doped oxide layer is formed on the surface of the doped crystalline silicon layer away from the tunnel oxide layer, and the insulating layer is formed on a surface of the doped oxide layer away from the doped crystalline silicon layer.

In some embodiments of the present application, parts of the first intrinsic non-crystalline silicon layer and the doped non-crystalline silicon layer at one end away from the second region are removed by laser, at a power of 6-12 W.

Additional aspects and advantages of the present application will be partly given in the following description, some of which will become apparent from the following description, or may be learned from practices of the present application.

In an aspect of the present disclosure, the present application provides a back-contact solar cell. According to an embodiment of the present disclosure, the back-contact solar cell includes:

a semiconductor substrate, where the semiconductor substrate has a first surface and a second surface opposite to each other, and the first surface includes multiple non-recessed regions and multiple recessed regions, and the non-recessed regions and the recessed regions are alternately arranged on the first surface;

a tunnel oxide layer and an N-type doped crystalline silicon layer, where the tunnel oxide layer is provided on the non-recessed region, and the N-type doped crystalline silicon layer is provided on a surface of the tunnel oxide layer away from the semiconductor substrate;

a first intrinsic non-crystalline silicon layer and a P-type doped non-crystalline silicon layer, where the N-type doped crystalline silicon layer and the P-type doped non-crystalline silicon layer have opposite conductivity types, the first intrinsic non-crystalline silicon layer is provided on the recessed region and extends on part of a surface of the N-type doped crystalline silicon layer away from the tunnel oxide layer, and the P-type doped non-crystalline silicon layer is provided on a surface of the first intrinsic non-crystalline silicon layer away from the semiconductor substrate, to form an staggered-lamination region of the first intrinsic non-crystalline silicon layer and the P-type doped non-crystalline silicon layer with the tunnel oxide layer and the N-type doped crystalline silicon layer; and an isolating structure, where the isolating structure includes an isolating layer and an isolating groove, in which the isolating layer is located between the first intrinsic non-crystalline silicon layer and the N-type doped crystalline silicon layer in the staggered-lamination region, and the isolating groove penetrates through the P-type doped non-crystalline silicon layer and the first intrinsic non-crystalline silicon layer in the staggered-lamination region.

In some embodiments of the present application, the isolating groove needs to sequentially penetrate through an electrically conductive glass layer, the P-type doped non-crystalline silicon layer, and the first intrinsic non-crystalline silicon layer in the staggered-lamination region.

In accordance with the back-contact solar cell according to the embodiment of the present application, compared with a HBC solar cell structure in related art, a tunnel oxide layer+n-poly-Si layer passivated contact is used in the present application to replace an intrinsic a-Si:H+a-Si:H(N) film for passivation in the existing HBC solar cell structure. Since the tunnel oxide layer+n-poly-Si layer is less sensitive to laser-induced thermal damage, the impact on the passivation effect of an N region can be reduced during a laser cutting process, thus further broadening the process window, and reducing the process difficulty. Compared with a TBC solar cell structure in related art, an intrinsic non-crystalline silicon layer i-a-Si+p-a-Si layer passivated contact is used in the present disclosure to replace SiOx+p-poly-Si in the existing TBC solar cell structure. By means of this, the problem of serious concentric circles on a silicon wafer due to two high-temperature processes of p poly and n poly in the TBC solar cells is avoided, to improve the surface passivation effect of a P region, and improve the electrical performance of the solar cell. Therefore, in the present application, the process window for preparing the back-contact solar cell is broadened, the process difficulty is reduced, and the surface passivation effect of the P region is improved. Therefore, the energy conversion efficiency Eta, the open-circuit voltage Uoc, the short-circuit current Isc, the filling factor FF, and the parallel resistance Rsh reach levels comparable to those of an existing HBC solar cell structure.

In addition, the back-contact solar cell according to the embodiment of the present application may further has the following additional technical features.

In some embodiments of the present application, the non-recessed region has a texture structure; and/or, the recessed region has a texture structure; and/or, the second surface has a texture structure; and/or, an edge of the recessed region in contact with the non-recessed region is oblique.

In some embodiments of the present application, the back-contact solar cell further includes: a first electrode layer and a second electrode layer. The first electrode layer is located at one side of the isolating groove, and the first electrode layer covers the P-type doped non-crystalline silicon layer. The second electrode layer is located at the other side of the isolating groove, and the second electrode layer covers the P-type doped non-crystalline silicon layer and the N-type doped crystalline silicon layer.

In some embodiments of the present application, the first electrode layer and the second electrode layer are transparent electrode layers. The materials of the first electrode layer and the second electrode layer are each independently at least one selected from indium-tin oxide, aluminum zinc oxide, hydrogen doped indium oxide, and indium-tungsten oxide.

In some embodiments of the present application, the materials of the first electrode layer and the second electrode layer are at least one selected from indium-tin oxide, aluminum zinc oxide, hydrogen doped indium oxide, and indium-tungsten oxide.

In some embodiments of the present application, the isolating layer includes an insulating layer, where the insulating layer is located between the first intrinsic non-crystalline silicon layer and the N-type doped crystalline silicon layer;

or the isolating layer includes a silicon nitride layer and a PSG layer, where the PSG layer is located on the surface of the N-type doped crystalline silicon layer away from the tunnel oxide layer, and the silicon nitride layer is located on a surface of the PSG layer away from the N-type doped crystalline silicon layer.

In some embodiments of the present application, the silicon nitride layer has a thickness of 50 to 110 nm; and/or, the PSG layer has a thickness of 25 to 35 nm.

In some embodiments of the present application, the back-contact solar cell further includes a passivation layer. The passivation layer includes a second intrinsic non-crystalline silicon layer and a silicon nitride passivation layer. The second intrinsic non-crystalline silicon layer is provided on the second surface, and the silicon nitride passivation layer is provided on a surface of the second intrinsic non-crystalline silicon layer away from the semiconductor substrate.

In some embodiments of the present application, the semiconductor substrate is an N-type semiconductor substrate, and the recessed region has a size in a width direction that is greater than the size of the non-recessed region in the width direction;

or the semiconductor substrate is a P-type semiconductor substrate, the recessed region has a size in a width direction that is less than the size of the non-recessed region in the width direction.

In some embodiments of the present application, the tunnel oxide layer is a tunnel $SiO_2$ layer; and/or, the tunnel oxide layer has a thickness of 1 to 4 nm, and preferably 1 to 1.8 nm; and/or, the N-type doped crystalline silicon layer has a thickness of 30 to 250 nm, and preferably 40 to 200 nm; and/or, the doping concentration of phosphorus in the N-type doped crystalline silicon layer is 8E19 to 5E20 cm−3, and preferably 3 to 9E20 cm−3; and/or, the first intrinsic non-crystalline silicon layer has a thickness of 10 to 20 nm; and/or, the P-type doped non-crystalline silicon layer has a thickness of 5 to 45 nm, and preferably 10 to 20 nm; and/or, the boron concentration doped in the P-type doped non-crystalline silicon layer is 10e20 cm−3 to 10e21 cm−3.

In another aspect of the present disclosure, the present application provides a method for preparing a back-contact solar cell. According to an embodiment of the present disclosure, the method includes the following steps:

providing a semiconductor substrate, where the semiconductor substrate has a first surface and a second surface opposite to each other, and the first surface includes first regions and the second regions arranged alternately;

forming a tunnel oxide layer, an N-type doped crystalline silicon layer, and an isolating layer sequentially on the first surface;

cutting the isolating layer in the second region by laser, to expose the semiconductor substrate in the second region, and leave over the tunnel oxide layer and the N-type doped crystalline silicon layer in the first region;

forming a first intrinsic non-crystalline silicon layer and a P-type doped non-crystalline silicon layer sequentially on a surface of the prepared intermediate away from the second surface;

removing part of the first intrinsic non-crystalline silicon layer, the P-type doped non-crystalline silicon layer and the isolating layer at one end away from the second region, to leave over the first intrinsic non-crystalline silicon layer and the P-type doped non-crystalline silicon layer staggered with the tunnel oxide layer and the N-type doped crystalline silicon layer, and form a staggered-lamination region; and forming a groove in the staggered-lamination region, to form an isolating groove, where the isolating groove penetrates through the P-type doped non-crystalline silicon layer and the first intrinsic non-crystalline silicon layer in the staggered-lamination region, to divide the staggered-lamination region into a first staggered-lamination region and a second staggered-lamination region.

In the method according to the embodiment of the present application, compared with a process for preparing a HBC solar cell in related art, a tunnel oxide layer+n-poly-Si layer passivated contact is used in the method to replace an intrinsic a-si:H+a-si:H(N) film for passivation in the existing HBC solar cell structure. Since the tunnel oxide layer+n-poly-Si layer is less sensitive to laser-induced thermal damage, the impact on the passivation effect of an N region can be reduced during a laser cutting process, thus further broadening the process window; and reducing the process difficulty. Compared with a process for preparing a TBC solar cell in related art, an intrinsic non-crystalline silicon layer i-a-Si+p-a-Si passivated contact is used in the method to replace $SiO_x$+p-poly-Si in the existing TBC solar cell structure. By means of this, the problem of serious concentric circles on a silicon wafer due to two high-temperature processes of p poly and n poly in the TBC solar cells is avoided, to improve the surface passivation effect of a P region, and improve the electrical performance of the solar cell. Therefore, by combining passivation with the tunnel oxide layer+n-poly-Si layer and passivation with the intrinsic non-crystalline silicon layer i-a-Si+p-a-Si layer in the method, the process window for preparing the back-contact solar cell is broadened, the process difficulty is reduced, and the surface passivation effect of the P region is improved. Therefore, the energy conversion efficiency Eta, the open-circuit voltage Uoc, the short-circuit current Isc, the filling factor FF, and the parallel resistance Rsh reach levels comparable to those of an existing HBC solar cell structure. In addition, by combining a texturing process and local etching, a previous texturing process is omitted.

In addition, the method according to the embodiment of the present application may further have the following implementations.

In some embodiments of the present application, the method further includes the following steps: performing alkaline texturing on the semiconductor substrate after the second region is exposed, to form a pyramidal texture structure on the second surface and in the second region.

In some embodiments of the present application, after the pyramidal texture structure is formed on the second surface and in the second region, a second intrinsic non-crystalline layer and a silicon nitride passivation layer are sequentially formed on the second surface.

In some embodiments of the present application, after a groove is formed in the staggered-lamination region, a first electrode layer is formed at one side of the isolating groove, and the first electrode layer covers the P-type doped non-crystalline silicon layer; and a second electrode layer is formed at the other side of the isolating groove, and the second electrode layer covers the P-type doped non-crystalline silicon layer and the N-type doped crystalline silicon layer.

In some embodiments of the present application, a first grid line is formed on part of a surface of the first electrode layer, and a second grid line is formed on part of a surface of the second electrode layer.

In some embodiments of the present application, the tunnel oxide layer and the N-type doped crystalline silicon layer are deposited by LPCVD.

In some embodiments of the present application, the isolating layer includes an insulating layer;

or the isolating layer includes a silicon nitride layer and a PSG layer, where the PSG layer is formed on the surface of the N-type doped crystalline silicon layer away from the tunnel oxide layer, and the silicon nitride layer is formed on a surface of the PSG layer away from the N-type doped crystalline silicon layer.

In some embodiments of the present application, parts of the first intrinsic non-crystalline silicon layer and the P-type doped non-crystalline silicon layer at one end away from the second region are removed by laser, at a power of 6-15 W.

It should be understood that both the foregoing general description and the following detailed description are merely exemplary and explanatory, and not intended to limit the present application.

BRIEF DESCRIPTION OF THE DRAWINGS

The above and/or other additional aspects and advantages of the present application will become apparent and comprehensible from the description of embodiments in connection with accompanying drawings, in which.

LIST OF REFERENCE NUMERALS

Figure 1:
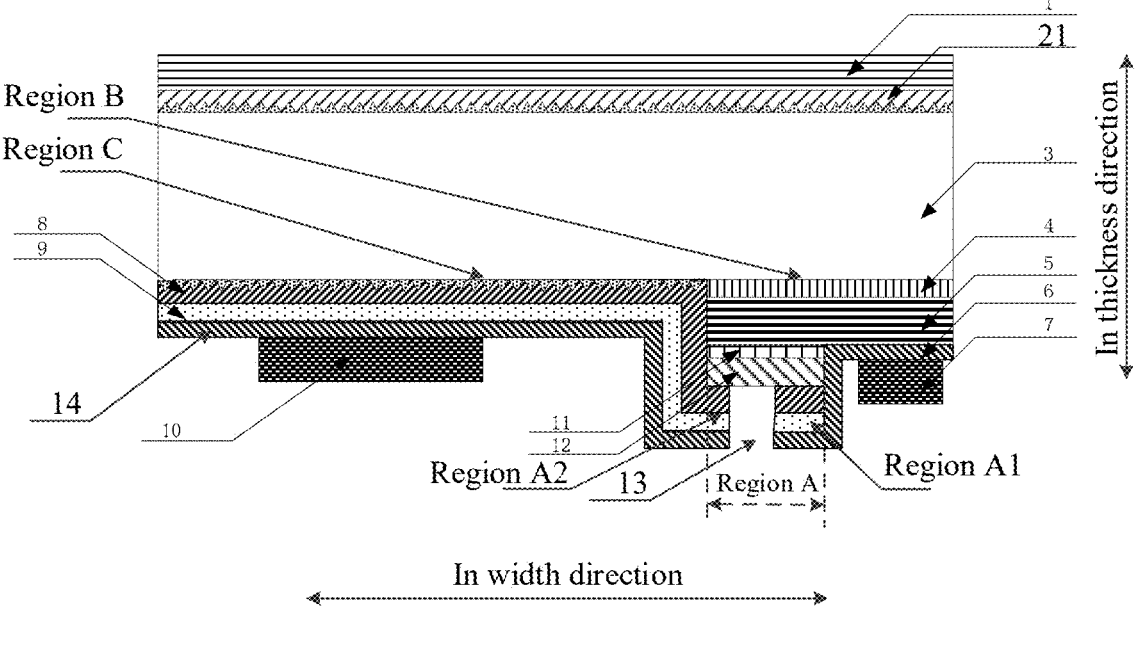
FIG. 1 is a schematic structural view of a back-contact solar cell according to an embodiment of the present application.

1—silicon nitride passivation layer, 21—oxide passivation layer, 22—second intrinsic non-crystalline silicon layer, 3—semiconductor substrate, 3-1—first surface, 3-2—second surface, 4—tunnel oxide layer, 5—doped crystalline silicon layer, 6—second electrode layer, 7—second grid line, 8—first intrinsic non-crystalline silicon layer, 9—doped non-crystalline silicon layer, 10—first grid line, 11—doped oxide layer, 12—insulating layer, 13—isolating groove, 14—first electrode layer, B—first region, C—second region, A—staggered-lamination region, A1—first staggered-lamination region, A2—second staggered-lamination region.

DETAILED DESCRIPTION

Embodiments of the present application are described in detail below, and examples thereof are illustrated in the drawings, where the same or similar elements or the elements having the same or similar functions are denoted by the same or similar reference numerals throughout the description. The embodiments described below with reference to the accompanying drawings are exemplary and provided merely for explaining the present application, and should not be construed as a limitation on the present application.

In an aspect of the present application, the present application provides a back-contact solar cell. According to an embodiment of the present application, referring to FIG. 1, the back-contact solar cell includes: a semiconductor substrate 3, where the semiconductor substrate 3 has a first surface 3-1 and a second surface 3-2 opposite to each other, and the first surface 3-1 includes adjacent first region (region B) and second region (region C); a tunnel oxide layer 4 and a doped crystalline silicon layer 5, where the tunnel oxide layer 4 is provided on the first region (region B), and the doped crystalline silicon layer 5 is located on a surface of the tunnel oxide layer 4 away from the semiconductor substrate 3; a first intrinsic non-crystalline silicon layer 8 and a doped non-crystalline silicon layer 9, where the doped crystalline silicon layer 5 and the doped non-crystalline silicon layer 9 have opposite conductivity types, the first intrinsic non-crystalline silicon layer 8 is located in a second region (region C) and extends on part of a surface of the doped crystalline silicon layer 5 away from the tunnel oxide layer, and the doped non-crystalline silicon layer 9 is located on a surface of the first intrinsic non-crystalline silicon layer 8 away from the semiconductor substrate 3, to form a staggered-lamination region (region A) of the first intrinsic non-crystalline silicon layer 8 and the doped non-crystalline silicon layer 9 with the tunnel oxide layer 4 and the doped crystalline silicon layer 5; and an isolating structure, where the isolating structure includes an isolating layer and an isolating groove 13, the isolating groove 13 is located between the first intrinsic non-crystalline silicon layer 8 and the doped crystalline silicon layer 5 in the staggered-lamination region (region A); and the isolating groove penetrates through the doped non-crystalline silicon layer 9 and the first intrinsic non-crystalline silicon layer 8 in the staggered-lamination region. Therefore, compared with an HBC solar cell structure in related art, a tunnel oxide layer 4+doped crystalline silicon layer 5 passivated contact is used in the present application to replace an intrinsic a-Si:H+a-Si:H(N) film in the existing HBC solar cell structure. Since the tunnel oxide layer 4+doped crystalline silicon layer 5 is less sensitive to laser-induced thermal damage, the impact on the passivation effect of a doped region corresponding to the first region can be reduced during a laser cutting process, thus further broadening the process window, and reducing the process difficulty. Compared with a TBC solar cell structure in related art, a first intrinsic non-crystalline silicon layer i-a-Si+doped non-crystalline silicon layer 9 passivated contact is used in the present disclosure to replace SiOx+p-poly-Si in the existing TBC solar cell structure. By means of this, the problem of serious concentric circles on a silicon wafer due to two high-temperature processes of p poly and n poly in the TBC solar cells is avoided, to improve the surface passivation effect of a doped region corresponding to the second region, and improve the electrical performance of the solar cell. Therefore, the structure of the back-contact solar cell according to the present application broadens the process window for preparing the back-contact solar cell, reduces the process difficulty, and improves the surface passivation effect of the doped region. Therefore, the energy conversion efficiency Eta, the open-circuit voltage Uoc, and the filling factor FF of the solar cell reach levels comparable to those of an existing HBC solar cell structure. In addition, in the back-contact solar cell according to the present application, an oxide passivation layer 21+silicon nitride passivation layer 1 is used to replace a front-side intrinsic a-Si:H+SiNx film in the conventional HBC, whereby the problems of large parasitic absorption by intrinsic non-crystalline silicon and large reflectivity of a light receiving surface in the conventional HBC are solved, and the short-circuit current of the solar cell is improved.

According to a specific embodiment of the present disclosure, the doped non-crystalline silicon layer 9 is a P-type doped non-crystalline silicon layer 9 (p-a-Si), and the doped crystalline silicon layer 5 is an N-type doped crystalline silicon layer 5 (n-poly-Si). That is, in the solar cell structure according to this embodiment, the first intrinsic non-crystalline silicon layer 8+boron doped non-crystalline silicon layer 9 is used in a doped region corresponding to the second region, and the tunnel oxide layer 4+phosphorus doped crystalline silicon layer 5 is used in a doped region corresponding to the first region.

According to a specific embodiment of the present application, the doped non-crystalline silicon layer 9 is an N-type doped non-crystalline silicon layer 9 (n-a-Si), and the doped crystalline silicon layer 5 is a P-type doped crystalline silicon layer 5 (p-poly-Si). That is, in the solar cell structure according to this embodiment, the first intrinsic non-crystalline silicon layer 8+phosphorus doped non-crystalline silicon layer 9 is used in a doped region corresponding to the second region, and the tunnel oxide layer 4+boron doped crystalline silicon layer 5 is used in a doped region corresponding to the first region.

In an embodiment of the present application, the semiconductor substrate 3 may be made of silicon (Si) or germanium (Ge) and the like, or gallium arsenide (GaAs) and the like. In terms of the conductivity type, the semiconductor substrate 3 may be an N-type semiconductor substrate 3, or a P-type semiconductor substrate 3. It is to be understood that the first surface 3-1 of the semiconductor substrate 3 means a back surface, the second surface 3-2 of the semiconductor substrate 3 means a light receiving surface.

In an embodiment of the present application, the specific type of the tunnel oxide layer 4 is not particularly limited. As a specific example, the tunnel oxide layer 4 is a tunnel $SiO_2$ layer. According to some specific embodiments of the present application, the tunnel oxide layer 4 has a thickness of 1.2 to 1.8 nm (for example, 1.2/1.3/1.4/1.5/1.6/1.7/1.8 nm). By defining the thickness of the tunnel oxide layer 4 within the above range, a good surface passivation effect can be further ensured, and a majority carrier tunnel effect is guaranteed.

According to some specific embodiments of the present application, the doped crystalline silicon layer 5 has a thickness of 80 to 200 nm (for example, 80/100/120/140/160/180/200 nm), and preferably 40 to 200 nm. By defining the thickness of the doped crystalline silicon layer 5 within the above range, the poly thickness is reduced as much as possible to reduce the parasitic absorption, while a good field passivation effect is ensured.

According to some specific embodiments of the present application, the doped crystalline silicon layer 5 has a diffusion sheet resistance of 70 to 110 $\Omega$/sq (for example, 70/80/90/100/110 $\Omega$/sq). Therefore, by defining the diffusion sheet resistance of the doped crystalline silicon layer 5 within the above range, a contact performance between a metal slurry and poly in a subsequent step is further improved, while a good field passivation effect is ensured.

According to some specific embodiments of the present application, the first intrinsic non-crystalline silicon layer 8 has a thickness of 5 to 30 nm, for example, 5/10/15/20/25/30 nm. By defining the thickness of the first intrinsic non-crystalline silicon layer 8 within the above range, a good passivation effect is achieved on the surface of the silicon substrate.

According to some specific embodiments of the present application, the doped non-crystalline silicon layer 9 has a thickness of 10 to 30 nm (for example, 10/15/20/25/30 nm). By defining the thickness of the doped non-crystalline silicon layer 9 within the above range, the subsequent laser treatment and cleaning steps.

According to some specific embodiments of the present application, the concentration of doping element (e.g. boron or phosphorus) in the doped non-crystalline silicon layer 9 is 10e20 cm−3 to 10e21 cm−3. By defining the concentration of doping element in the doped non-crystalline silicon layer 9 within the above range, good contact performance is achieved while the passivation effect is ensured.

According to some specific embodiments of the present application, the isolating layer includes an insulating layer 12, where the insulating layer 12 is located between the first intrinsic non-crystalline silicon layer and the doped crystalline silicon layer. In some examples, the insulating layer 12 may be a mask protective layer. The isolating groove 13 penetrates through the first intrinsic non-crystalline silicon layer 8 and the doped non-crystalline silicon layer 9 and extends to the mask protective layer. The mask protective layer, as a laser energy absorption layer, has the effect of reducing the impact of the laser cutting process on the passivation effect in the doped region corresponding to the first region, and the effect of providing a hydrogen source to further passivate the polycrystalline silicon and the substrate, thus improving the passivation effect, and protecting the doped crystalline silicon layer 5 from alkali corrosion in the texturing process. It is to be understood that the isolating groove may penetrate through the insulating layer 12, or may not penetrate through the insulating layer 12.

According to some specific embodiments of the present application, the isolating layer includes an insulating layer 12 and a doped oxide layer 11, where the doped oxide layer 11 is provided on a surface of the doped crystalline silicon layer away from the tunnel oxide layer, and the insulating layer 12 is provided on a surface of the doped oxide layer 11 away from the doped crystalline silicon layer. In some examples, the insulating layer 12 may be a mask protective layer. It is to be understood that the doped oxide layer 11 is naturally formed in the presence of oxygen during the process of phosphorus doping or boron doping of the doped crystalline silicon layer 5, and has a thickness of 25 to 35 nm. Similarly, the isolating groove may penetrate through the insulating layer 12 and the doped oxide layer 11, or may not penetrate through the insulating layer 12 and the doped oxide layer 11.

It can be understood that if the doped crystalline silicon layer 5 is an N-type doped crystalline silicon layer n-poly-Si (i.e. phosphorus doped), the formed doped oxide layer 11 is a PSG layer, namely, a phosphosilicate glass layer, having a composition of silica doped with phosphorus. If the doped crystalline silicon layer 5 is a P-type doped crystalline silicon layer p-poly-Si (i.e. Boron doped), the formed doped oxide layer 11 is a BSG layer, namely a borosilicate glass layer, having a composition of silica doped with boron.

In an embodiment of the present application, the specific type of the mask protective layer is not particularly limited. As some specific examples, the mask protective layer may be a SiNx layer. In some examples, the thickness of the mask protective layer may be 40 to 60 nm. Therefore, the above effect of the mask protective layer is further ensured.

Further, referring to FIG. 1, the back-contact solar cell further includes: a first electrode layer 14 and a second electrode layer 6. The first electrode layer 14 is located at one side of the isolating groove, and the first electrode layer 14 covers the doped non-crystalline silicon layer. The second electrode layer 6 is located at the other side of the isolating groove, and the second electrode layer 6 covers the doped non-crystalline silicon layer and the doped crystalline silicon layer. The first electrode layer 14 enhances the conductivity between the doped non-crystalline silicon layer 9 and a first grid line 10, and the second electrode layer 6 enhances the conductivity between the doped crystalline silicon layer 5 and a second grid line 7.

In an embodiment of the present application, the first electrode layer 14 and the second electrode layer 6 are transparent conductive layers. The specific materials of the first electrode layer 14 and the second electrode layer 6 are not particularly limited. As some specific examples, the materials of the first electrode layer 14 and the second electrode layer 6 are each independently at least one selected from indium-tin oxide, aluminum zinc oxide, hydrogen doped indium oxide, and indium-tungsten oxide. In some examples, the first electrode layer 14 and the second electrode layer 6 each independently have a thickness of 60 to 100 nm.

According to another specific embodiment of the present disclosure, referring to FIG. 1, the back-contact solar cell further includes: a passivation layer. The passivation layer includes an oxide passivation layer 21 and a silicon nitride passivation layer 1. The oxide passivation layer 21 is provided on the second surface 3-2, and the silicon nitride passivation layer I is provided on a surface of the oxide passivation layer 21 away from the semiconductor substrate 3. The silicon nitride passivation layer I can function as an anti-reflection film and a protective film, and also as a passivation film to inhibit the recombination of photocarriers. The oxide passivation layer 21 has the function of inhibiting the recombination of photocarriers at a bond interface with the second surface 3-2. In some examples, at least part of the second surface 3-2 is provided with a pyramidal texture structure. An orthogonal projection of the pyramidal structure on a surface of the semiconductor substrate has a size of 1-3 μm in a width direction, and the pyramidal structure has a size of 1.5-2 μm in a thickness direction. In this manner, the reflectivity of the second surface 3-2 is reduced to 9-11%. As a result, the problems of large parasitic absorption by intrinsic non-crystalline silicon and large reflectivity of a light receiving surface in the conventional HBC are solved, and the short-circuit current of the solar cell is further improved. In some examples, the first region has a texture structure; and/or, the second region has a texture structure. The texture structures in the first region and the second region are formed in the cleaning step in the preparation process of the back-contact solar cell.

According to some specific embodiments of the present application, the oxide passivation layer 21 has a thickness of 5 to 15 nm (for example, 5/7/9/10/12/15 nm), and the silicon nitride passivation layer 1 has a thickness of 70 to 110 nm (for example, 70/80/90/100/110110 nm). By defining the thickness of the oxide passivation layer 21 and the silicon nitride passivation layer 1 within above range, the problems of large parasitic absorption by intrinsic non-crystalline silicon and large reflectivity of a light receiving surface in the conventional HBC are solved, and the short-circuit current of the solar cell is further improved.

In another aspect of the present disclosure, the present application provides a method for preparing a back-contact solar cell. According to an embodiment of the present disclosure, the method includes:

S100: A semiconductor substrate is provided.

Figure 2:
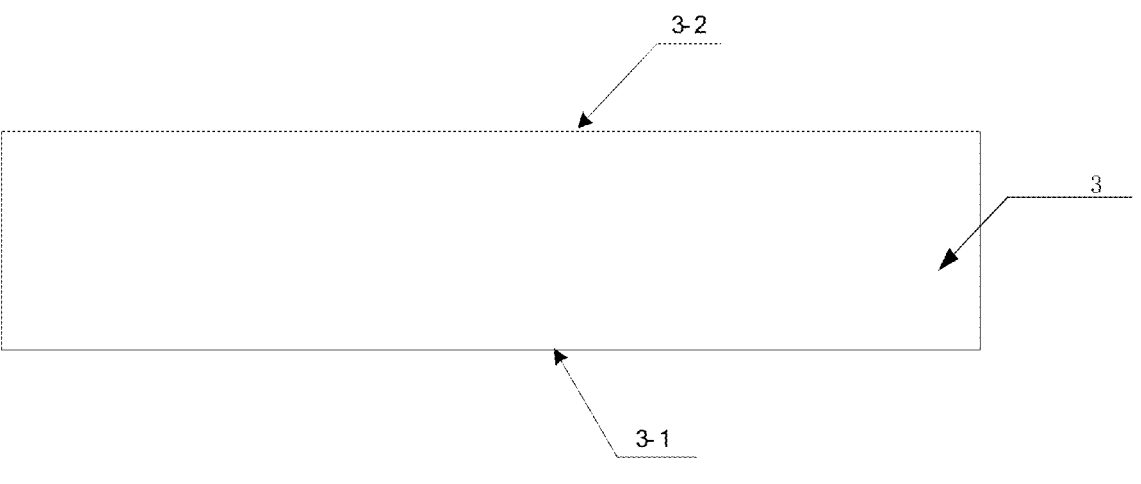
FIG. 2 is a schematic structural view of an intermediate in a process of preparing a back-contact solar cell according to an embodiment of the present application.

In this step, a semiconductor substrate 3 is provided, where the semiconductor substrate 3 has a first surface 3-1 and a second surface 3-2 opposite to each other, and the first surface includes adjacent first region and second region, as shown in FIG. 2. The first surface 3-1 of the semiconductor substrate 3 means a back surface, and the second surface 3-2 of the semiconductor substrate 3 means a light receiving surface. In an embodiment of the present application, the semiconductor substrate 3 may be made of silicon (Si) or germanium (Ge) and the like, or gallium arsenide (GaAs) and the like. The semiconductor substrate 3 can be an N-type silicon wafer or a P-type silicon wafer.

To ensure the cleanliness of the semiconductor substrate 3 and remove a cutting damage layer from the silicon wafer, a bare silicon wafer can be put into and polished in a tank-type polishing and cleaning machine. In some examples, the cleaning solution is a KOH solution with a concentration of 5.5-6.5% by weight, the temperature of the solution during cleaning is 81-87° C., and the cleaning time is 290-310 s, to obtain a square block with a size of 20±3 μm. The reflectivity of the back surface of the silicon wafer is 40-44%.

S200: A tunnel oxide layer, a doped crystalline silicon layer and an isolating layer are sequentially formed on the first surface.

In this step, a tunnel oxide layer 4 and an intrinsic or in-situ doped poly Si are prepared by low-pressure chemical vapor deposition (LPCVD), PECVD, PVD, PEALD or the like, and the tunnel oxide layer 4 and the polycrystalline silicon (poly) are preferably deposited on the back surface by LPCVD. The deposition temperature of the tunnel oxide layer 4 is 570-800° C., and the deposition temperature of the poly layer is 570-800° C. An intrinsic a-Si:H+a-Si:H(N) film in the existing HBC solar cell structure is often deposited by using an expensive CVD apparatus. In the present application, a cheap LPCVD apparatus is used to replace the expensive CVD apparatus, thus greatly reducing the equipment investment cost.

Then an intermediate after the polycrystalline silicon (poly) layer is deposited is placed in a tubular diffusion furnace, a phosphorus-containing compound (such as phosphorus oxychloride) is introduced, and the polycrystalline silicon is converted into an N-type crystalline silicon layer at a high temperature of 750-880° C.; or a boron-containing compound is introduced, and the polycrystalline silicon is converted into a P-type crystalline silicon layer at a high temperature of 980-1050° C. It is to be understood that a doped oxide layer 11 is naturally formed in the presence of oxygen in the phosphorus doping process of poly-Si, which has a thickness of 25 to 35 nm. Particularly, a PSG layer is naturally formed in the presence of oxygen in the phosphorus doping process of poly-Si, and the PSG layer has the effect of strengthening the mask. A BSG layer is naturally formed in the presence of oxygen in the boron doping process of poly-Si, and the BSG layer has the effect of strengthening the mask.

In some examples, the doped crystalline silicon layer 5 has a diffusion sheet resistance of 70 to 110 Ω/sq. In some examples, the doped crystalline silicon layer 5 has a thickness of 80 to 200 nm. In some examples, the tunnel oxide layer 4 has a thickness of 1.2 to 1.8 nm. In an embodiment of the present application, the specific type of the tunnel oxide layer 4 is not particularly limited. For example, the tunnel oxide layer 4 is a tunnel SiO2 layer.

Figure 3:
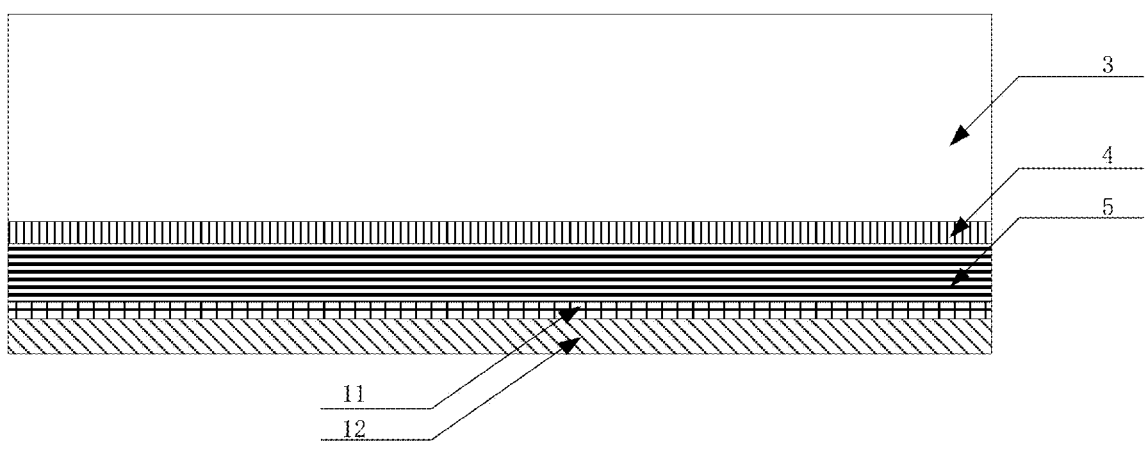
FIG. 3 is a schematic structural view of an intermediate in a process of preparing a back-contact solar cell according to an embodiment of the present application.

Finally, an insulating layer is formed on the surface of the doped oxide layer. In some examples, the insulating layer may be a mask protective layer. The mask protective layer is deposited by PECVD at a temperature of 400-600° C. The mask protective layer, as a laser energy absorption layer, has the effect of reducing the impact of the laser cutting process on the passivation effect in the doped region corresponding to the first region, and the effect of providing a hydrogen source to further passivate the polycrystalline silicon and the substrate, thus improving the passivation effect, and protecting the doped crystalline silicon layer 5 from alkali corrosion in the texturing process. The intermediate prepared in S200 has a structure as shown in FIG. 3.

In an embodiment of the present application, the specific type of the mask protective layer is not particularly limited. For example, the mask protective layer may be a SiNx layer. In some examples, the thickness of the mask protective layer may be 40 to 60 nm. Therefore, the above effect of the mask protective layer is further ensured. In some examples, the reflectivity of the mask protective layer may be 2.3 to 2.5. Therefore, the above effect of the mask protective layer is further ensured.

S300: The isolating layer in the second region is cut by laser.

Figure 4:
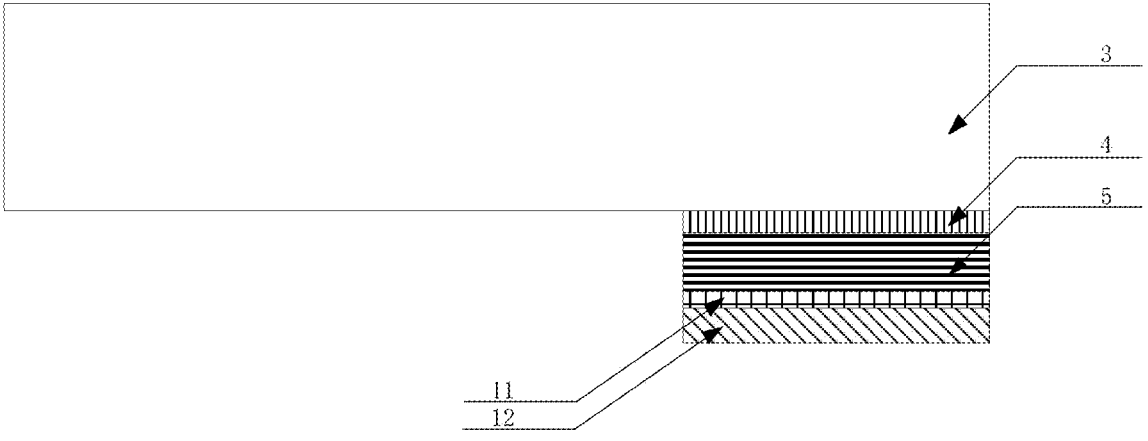
FIG. 4 is a schematic structural view of an intermediate in a process of preparing a back-contact solar cell according to an embodiment of the present application.

In this step, the isolating layer in the second region is cut by laser, to expose the second region and leave over the tunnel oxide layer and the doped crystalline silicon layer in the first region. The structure is as shown in FIG. 4. In the present application, a tunnel oxide layer 4+doped crystalline silicon layer 5 passivated contact is used to replace an intrinsic a-si:H+a−si:H(N) film in the existing HBC solar cell structure, and the tunnel oxide layer 4+doped crystalline silicon layer 5 is less sensitive to laser-induced thermal damage. Therefore, in this step, a laser cutting process can be directly performed, without patternization by performing masking and demasking techniques for many times, thus further broadening the process window, and reducing the process difficulty. In the existing HBC solar cell structure, patternization is generally performed by largely using masking and demasking techniques in this step, the production cost is high, and the process control difficulty is high. In the present application, the steps of masking and demasking in the laser cutting process are omitted in this step, thus improving the production efficiency.

In an embodiment of the present application, the screen shape can be designed by patternization, the laser type can be nanosecond green laser, picosecond ultraviolet laser, picosecond green laser or nanosecond ultraviolet laser.

S400: A first intrinsic non-crystalline silicon layer and a doped non-crystalline silicon layer are sequentially formed on a surface of the intermediate prepared in Step S300 away from the second surface.

In this step, a first intrinsic non-crystalline silicon layer 8 and a doped non-crystalline silicon layer 9 are sequentially formed on a surface of the intermediate prepared in Step S300 away from the second surface 3-2 by CVD. Particularly, the deposition temperature of the first intrinsic non-crystalline silicon layer 8 is 180-300° C., the deposition temperature of a P-type non-crystalline silicon layer is 180-300° C., and the deposition temperature of an N-type non-crystalline silicon layer is 180-300° C. A first intrinsic non-crystalline silicon layer 8 i-a-Si+doped non-crystalline silicon layer 9 passivated contact is used in the present disclosure to replace SiOx+doped crystalline silicon layer 5 in the existing TBC solar cell structure, to improve the surface passivation effect of a doped region corresponding to the second region, and improve the electrical performance of the solar cell. In some examples, the first intrinsic non-crystalline silicon layer 8 has a thickness of 5 to 30 nm. In some examples, the doped non-crystalline silicon layer 9 has a thickness of 10 to 30 nm.

Figure 6:
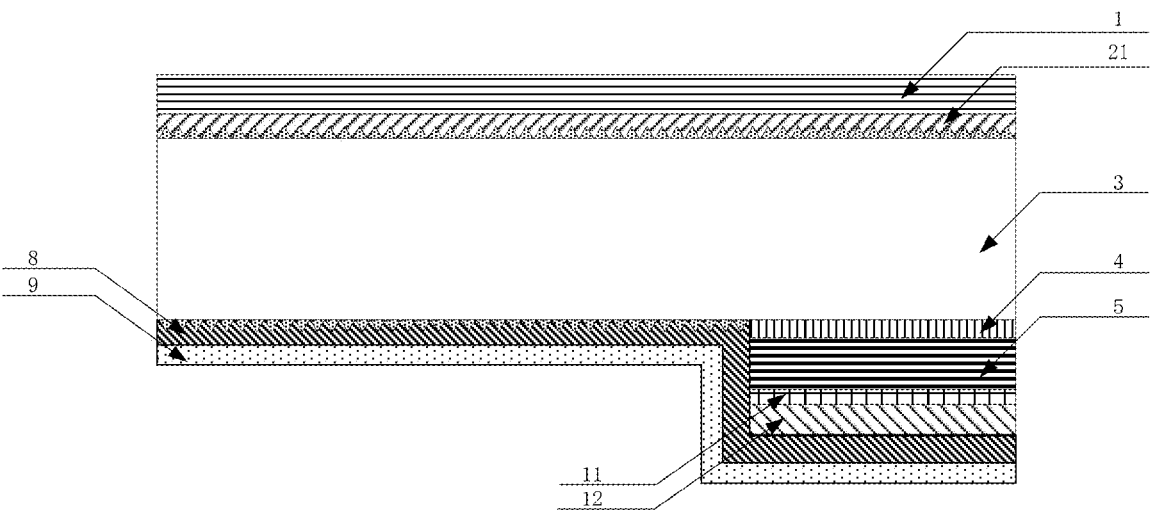
FIG. 6 is a schematic structural view of an intermediate in a process of preparing a back-contact solar cell according to an embodiment of the present application.

According to a specific embodiment of the present disclosure. Step S400 further includes: before the first intrinsic non-crystalline silicon layer and the doped non-crystalline silicon layer are formed, depositing an oxide passivation layer 21 and a silicon nitride passivation layer 1 sequentially on the second surface 3-2. The deposition temperature of the oxide passivation layer 21 is 250±20° C., and the deposition temperature of the silicon nitride passivation layer 1 is 550±20° C. The prepared intermediate is shown in FIG. 6. The silicon nitride passivation layer 1 can function as an anti-reflection film and a protective film, and also as a passivation film to inhibit the recombination of photocarriers. The oxide passivation layer 21 has the function of inhibiting the recombination of photocarriers at a bond interface with the second surface 3-2.

It is to be understood that the reason for depositing the oxide passivation layer and the silicon nitride passivation layer before the first intrinsic non-crystalline silicon layer and the doped non-crystalline silicon layer are formed is that the oxide passivation layer and the silicon nitride passivation layer requires high-temperature treatment, and the doped non-crystalline silicon layer is avoided to experience high temperature by means of this step. In addition, a thin layer of silica will be formed on the texture in the exposed second region by the high-temperature treatment of the oxide passivation layer and the silicon nitride passivation layer. Therefore, the exposed second region experiencing high temperature is etched by standing in an acid solution (e.g. HF solution) for about 30 s, to remove the silica thereon.

Figure 5:
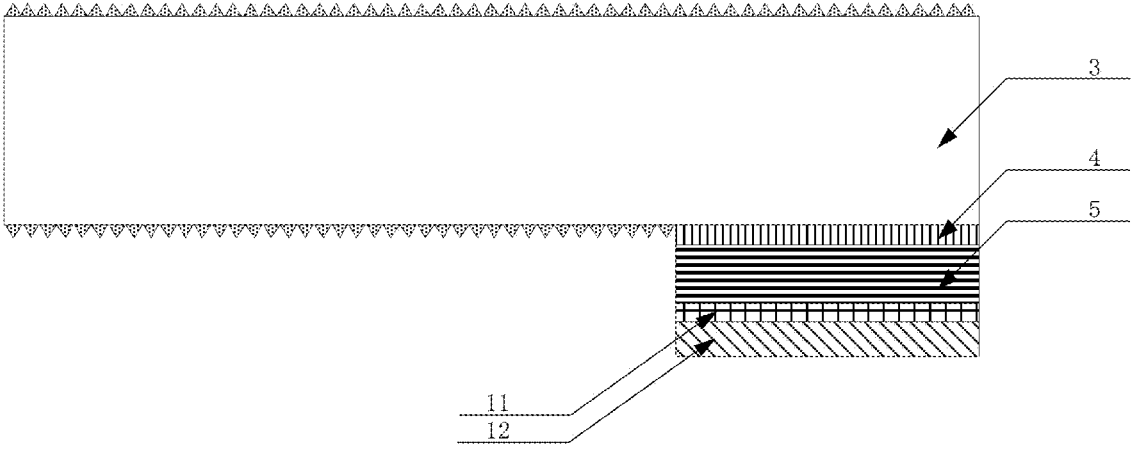
FIG. 5 is a schematic structural view of an intermediate in a process of preparing a back-contact solar cell according to an embodiment of the present application.

Further, between Steps S300 and S400, the method further includes: alkaline texturing the surface of the intermediate prepared in Step S300 to form a pyramidal texture structure on the second surface and in the second region, and removing the tunnel oxide layer 4, the doped crystalline silicon layer 5 and the isolating layer remaining in the second region after laser cutting. Specifically, the intermediate after Step S300 is sequentially placed in a hydrofluoric acid tank, a texturing tank, an SC1 cleaning tank, a CP smoothing groove, an SC2 cleaning tank and an acid cleaning tank. The hydrofluoric acid tank is used to remove the tunnel oxide layer 4, the doped crystalline silicon layer 5 and the isolating layer remaining in the second region after laser cutting. The texturing groove is used to carry out texturing in the laser treated region and region of the second surface 3-2 at the same time. The SC1 cleaning tank is mainly used to remove the contaminant and chemical residue on the surface of the intermediate. The CP smoothing groove is used to smooth the top and bottom of the pyramid, to prevent the deposition and epitaxial growth of non-crystalline silicon. The SC2 cleaning tank is used to remove the metal residue on the silicon wafer. The acid cleaning tank is used for chemical passivation of the intermediate, to form a hydrophobic structure. Therefore, the removal of the residue in the second region after laser cutting and the texturing of the second surface 3-2 are completed in this step, such that the second surface 3-2 has a pyramidal texture structure thereon, as shown in FIG. 5. According to some specific embodiments of the present application, an orthogonal projection of the pyramidal structure on a surface of the semiconductor substrate has a size of 1-3 μm in a width direction, and the pyramidal structure has a size of 1.5-2 μm in a thickness direction. Therefore, the problems of large parasitic absorption by intrinsic non-crystalline silicon and large reflectivity of a light receiving surface in the conventional HBC are solved. In this manner, the reflectivity of the second surface 3-2 is reduced to 9-11%, and the short-circuit current of the solar cell is further improved.

> S500: Parts of the first intrinsic non-crystalline silicon layer, the doped non-crystalline silicon layer and the isolating layer at one end away from the second region are removed.

In this step, parts of the first intrinsic non-crystalline silicon layer, the doped non-crystalline silicon layer and the isolating layer at one end away from the second region are removed, to leave over the first intrinsic non-crystalline silicon layer and the doped non-crystalline silicon layer staggered with the tunnel oxide layer and the doped crystalline silicon layer, and form an staggered-lamination region.

Figure 7:
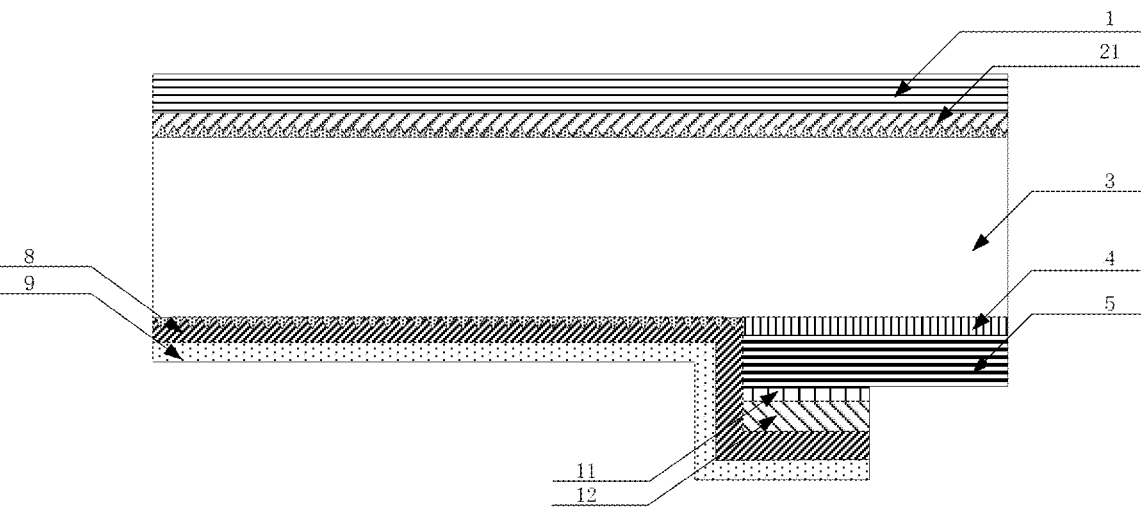
FIG. 7 is a schematic structural view of an intermediate in a process of preparing a back-contact solar cell according to an embodiment of the present application.

Specifically, parts of the first intrinsic non-crystalline silicon layer and the doped non-crystalline silicon layer at one end away from second region are removed by laser, to expose the isolating layer. The laser type can be nanosecond green laser, picosecond ultraviolet laser, picosecond green laser or nanosecond ultraviolet laser. In some examples, the laser has a power of 6-12 W. Then, the exposed isolating layer is removed by an acid solution (such as HF solution), to expose part of the dope crystalline silicon layer 5, leave over the first intrinsic non-crystalline silicon layer 8 and the doped non-crystalline silicon layer 9 staggered with the tunnel oxide layer 4 and the doped crystalline silicon layer 5, and form an staggered-lamination region (region A). The structure of the intermediate is shown in FIG. 7. Step S500 aims to expose part of the doped crystalline silicon layer 5 in the grooved region, to facilitate the subsequent steps to prepare the second electrode layer and the second grid line. In some embodiments, the mass concentration of the HF solution is 7-9%, and the acid cleaning time at room temperature for 380-420 s.

> S600: A groove is formed in the staggered-lamination region.

Figure 9:
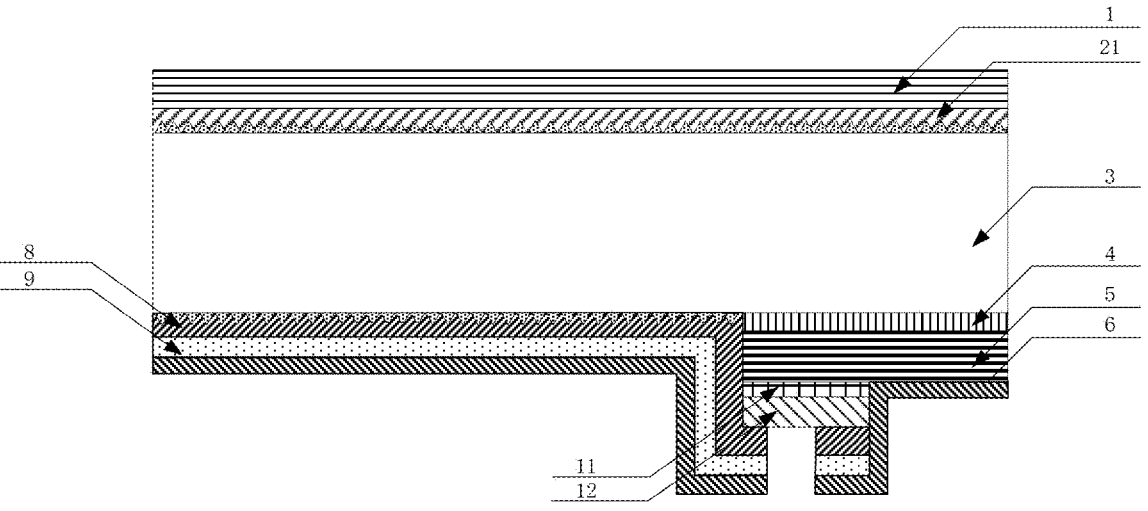
FIG. 9 is a schematic structural view of an intermediate in a process of preparing a back-contact solar cell according to an embodiment of the present application.

In this step, a groove is formed in the staggered-lamination region (region A) by laser ablation, to expose part of the isolating layer and form an isolating groove 13. The isolating groove 13 divides the staggered-lamination region (region A) into a first staggered-lamination region (region A1) and a second staggered-lamination region (region A2), as shown in FIG. 9.

In Steps S500 and S600, since the tunnel oxide layer+doped crystalline silicon layer is less sensitive to laser-induced thermal damage, the impact on the film in a doped region corresponding to the first region can be reduced during a laser cutting process. In the case of the first intrinsic non-crystalline silicon layer and the doped non-crystalline silicon layer in a conventional HBC, the first intrinsic non-crystalline silicon layer and the doped non-crystalline silicon layer will be affected by the high-temperature ablation by laser, and the structure of amorphous silicon and the attachment of the first intrinsic non-crystalline silicon layer to the semiconductor substrate are changed, in the process of laser etching, causing detachment of film or impact on the passivation effect. In this solution, the tunnel oxide layer and the doped crystalline silicon layer are deposited in the first region at high temperature, the lattice of the tunnel oxide layer and the doped crystalline silicon layer are stable after experiencing the high temperature. Even after the laser treatment, the tunnel oxide layer and the doped crystalline silicon layer still remain stable, thus further broadening the process window for laser etching, allowing the use of laser having more frequencies and energies, and reducing the process difficulty.

In some examples, the isolating groove 13 has a width of 20-200 μm, and preferably 80-120 μm.

Figure 8:
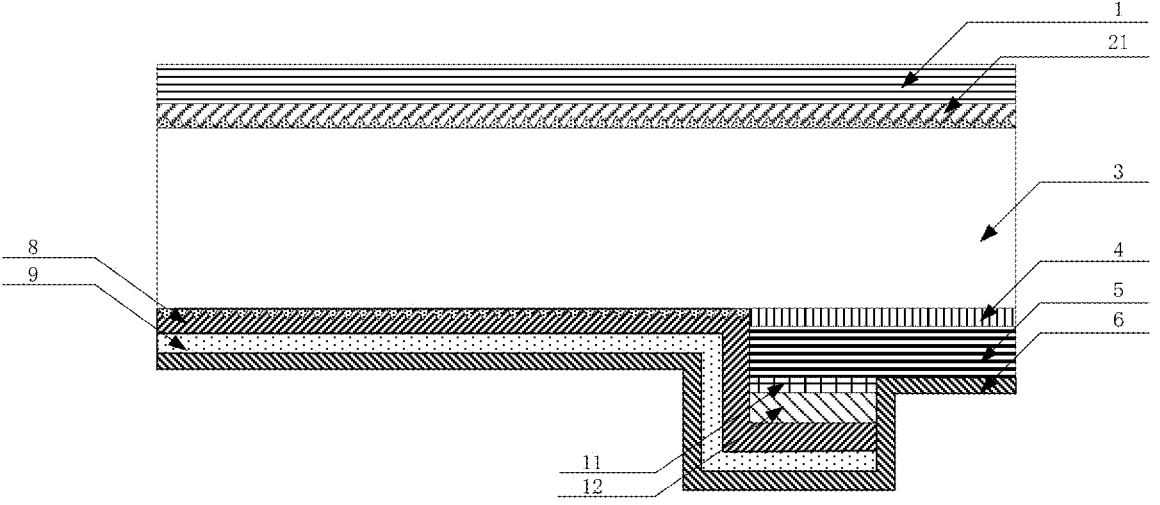
FIG. 8 is a schematic structural view of an intermediate in a process of preparing a back-contact solar cell according to an embodiment of the present application.

Further, after a groove is formed in the staggered-lamination region, the method further includes: forming a first electrode layer at one side of the isolating groove, where the first electrode layer covers the doped non-crystalline silicon layer; and forming a second electrode layer at the other side of the isolating groove, where the second electrode layer covers the doped non-crystalline silicon layer and the doped crystalline silicon layer. The first electrode layer enhances the conductivity between the doped non-crystalline silicon layer 9 and a first grid line 10, and the second electrode layer enhances the conductivity between the doped crystalline silicon layer 5 and a second grid line 7. In some embodiments, an electrode layer can be formed on the surface of the doped non-crystalline silicon layer, where the structure of the intermediate is as shown in FIG. 8; and then a groove is formed in the staggered-lamination region, as shown in FIG. 9.

In an embodiment of the present application, the first electrode layer and the second electrode layer are transparent conductive layers. The specific materials of the first electrode layer and the second electrode layer are not particularly limited. As some specific examples, the materials of the first electrode layer and the second electrode layer are each independently at least one selected from indium-tin oxide, aluminum zinc oxide, hydrogen doped indium oxide, and indium-tungsten oxide. In some examples, the first electrode layer and the second electrode layer each independently have a thickness of 60 to 100 nm.

Further, the method further includes: forming a first grid line on part of a surface of the first electrode layer, and forming a second grid line on part of a surface of the second electrode layer. Specifically, the first grid line is formed on part of the surface of the first electrode layer, and the second grid line is formed on part of the surface of the second electrode layer, by screen printing, inkjet printing, laser transfer printing, chemical plating, electroplating, or PVD.

In the method according to the embodiment of the present application, compared with a process for preparing a HBC solar cell in related art, a tunnel oxide layer+doped crystalline silicon layer passivated contact is used in the method to replace an intrinsic a-Si:H+a-Si:H(N) film in the existing HBC solar cell structure, compared with a process for preparing an HBC solar cell in related art. Since the tunnel oxide layer+doped crystalline silicon layer is less sensitive to laser-induced thermal damage, the impact on the passivation effect of a doped region corresponding to the first region can be reduced during a laser cutting process, thus further broadening the process window, and reducing the process difficulty. Compared with a process for preparing a TBC solar cell in related art, a first intrinsic non-crystalline silicon layer i-a-Si+doped non-crystalline silicon layer passivated contact is used in the method to replace SiOx+p-poly-Si in the existing TBC solar cell structure. By means of this, the problem of serious concentric circles on a silicon wafer due to two high-temperature processes of p poly and n poly in the TBC solar cells is avoided, to improve the surface passivation effect of a doped region corresponding to the second region, and improve the electrical performance of the solar cell. Therefore, the method broadens the process window for preparing the back-contact solar cell, reduces the process difficulty, and improves the surface passivation effect of the doped region. Therefore, the energy conversion efficiency Eta, the open-circuit voltage Uoc, and the filling factor FF of the solar cell reach levels comparable to those of an existing HBC solar cell structure. In addition, an oxide passivation layer+silicon nitride passivation layer is used in the method to replace a front-side intrinsic a-si:H+SiNx film in the conventional HBC, whereby the problems of large parasitic absorption by intrinsic non-crystalline silicon and large reflectivity of a light receiving surface in the conventional HBC are solved, and the short-circuit current of the solar cell is improved. Moreover, during the deposition of the tunnel oxide layer and the doped crystalline silicon layer, a cheap LPCVD apparatus is used to replace the expensive CVD apparatus, thus greatly reducing the equipment investment cost.

Examples of the present disclosure are described in detail below. It is to be understood that the examples described below are exemplary and only used to explain the present application, and should not be construed as a limitation on the present application. In addition, unless otherwise specifically stated, all reagents used in the following examples are commercially available, or can be synthesized according to the methods herein or known in the art, and the reaction conditions not listed are also readily available to those skilled in the art.

Example 1

A solar cell was provided in this example, which was prepared through a process as follows.

1) An N-type silica wafer of 1.3 Ωcm and 166*166 and having a thickness of 165 μm was provided.

2) Polishing and cleaning: The silicon wafer was placed in a tank-type alkaline polishing machine for polishing and cleaning. The working volume of the tank body of the cleaning machine was 360 L. The silicon wafer was pre-cleaned, to remove organic and other contaminants generated during the cutting and transportation of the silicon wafer. In this example, the No. 1 solution for standard RCA cleaning was used for cleaning. The No. 1 solution had a composition of $NH_4OH$—$H_2O_2$—$H_2O$, at a volume ratio of 1:1:5. The cleaning temperature was 65° C. The cleaning with an SC-1 reagent was mainly alkaline oxidation, to remove particles on the silicon wafer, and oxidize and remove a small amount of organic matter and metal atom contaminants such as Au, Ag, Cu, Ni, Cd, Zn, Ca, and Cr on the surface. Water cleaning was then carried out to remove residual chemicals. Next, alkaline polishing treatment was performed, using an alkaline polishing solution containing 5.97% wt KOH, at a temperature of 80° C., for an alkaline polishing treatment time of 300 s, to remove the damage and polish the silicon wafer. Then SC1 cleaning, ozone cleaning, and final acid cleaning and dewatering were performed, to complete the polishing and cleaning.

3) The polished silicon wafer was fed into a low-pressure vapor deposition (LPCVD) apparatus, and 1.4 nm-thick tunnel SiO2 and 90 nm-thick intrinsic polycrystalline silicon poly Si were obtained after deposition. The deposition temperature of tunnel SiO2 was 590° C., and the deposition temperature of intrinsic polycrystalline silicon poly Si was 590° C.

4) The intermediate after the polycrystalline silicon (poly) layer was deposited was placed in a tubular diffusion furnace, phosphorus oxychloride was introduced, and phosphorus doping of the poly Si region and crystallization of poly were completed at 870° C., to form an N-type crystalline silicon layer n-poly-Si, having a diffusion sheet resistance of 90 Ω/sq. In this process, a PSG layer with a thickness of about 30 nm was formed. It is to be understood that poly Si will transition from a non-crystalline to a crystalline state at a high temperature, and 100% crystallization can be completed here, because of the high temperature for phosphorus diffusion.

5) A SiNx monolayer film with a thickness of 50 nm and a refractive index of 2.4% was deposited on the surface of the N-type crystalline silicon layer n-poly-Si by PECVD, and the SiNx monolayer film was used as a mask layer.

6) The SiNx film in the P region was cut by using a 532 nm green nanosecond laser, to expose the back surface of the silicon wafer.

7) The laser treated silicon wafer was placed in a texturing machine. The working volume of the tank of the machine was 360 L. The main processes and functions were as follows: 1% wt HF at 25° C. was used in a first functional tank to remove the residue. The cleaned silicon wafer was fed to a next texturing tank. The texturing solution was 3.29% wt KOH solution, the texturing temperature was 82° C., and the texturing time was 570 s. Thus, the texturing treatment of the front and back laser-treated regions was completed. Then efficient SC1 cleaning was performed, using a cleaning solution of NH4OH—H2O2-H2O, at a volume ratio of 1:1:5. The cleaning temperature was 65° C., and the cleaning time was 300 s. The pyramid was smoothed using 50 ppm O3 water containing HF, where the concentration of hydrofluoric acid was 0.31% wt. SC2 cleaning was performed to remove metal residues. The cleaning solution was HCL-H2O2-H2O at a volume ratio of 1:1:5, the cleaning temperature was 65° C., and the cleaning time was 200 s. Finally, cleaning with 5% wt hydrofluoric acid was carried out to complete the texturing.

8) A PEALD apparatus was used. An Al2O3 layer was deposited on the front surface, where the deposition temperature was 260° C., and the deposition thickness was 10 nm. Then, SiNx was deposited on the Al2O3 layer, where the deposition temperature was 550° C., the deposition thickness was 90 nm, and the refractive index was 2.1%.

Then, the back surface of the silicon wafer with exposed P region was immersed in an HF solution for 30 s.

9) A 15 nm-thick a-si:H (that is, first intrinsic non-crystalline silicon layer i-a-Si) and a 25 nm-thick a-si:H(P) (that is, P-type non-crystalline silicon layer p-a-Si) were sequentially deposited on the back surface by CVD, where the deposition temperature of a-si:H was 200° C., and the deposition temperature of a-si:H(P) was 200° C.

10) One end of the P-type non-crystalline silicon layer p-a-Si away from the P doped region was cut by using a nanosecond laser, to expose the SiNx mask layer. The laser had a power of 12 W.

11) The exposed SiNx mask layer in Step 10) was cleaned with 8% wt hydrofluoric acid, to remove the SiNx mask layer and PSG layer in the grooved region, and expose the N-type crystalline silicon layer n-poly-Si. Meanwhile, after treatment with hydrofluoric acid, part of the SiNx layer was removed, and the thickness of the front SiNx was 80 nm.

12) An indium-tin oxide (ITO) layer was deposited on the back surface, where the thickness was 80 nm.

13) A groove was formed using a 355 nm ultraviolet picosecond laser, to expose the SiNx mask layer, and form an isolating groove, which insulate the N region and P region, to prevent electric leakage caused by the interconnection of the N/P region. The insulating resistance of the insulated area was tested to be >10 MΩ, and the laser width was 100 μm.

14) A metallized electrode was prepared on the back surface by screen printing using metallic silver, solidified, and annealed.

Example 2

A solar cell was provided in this example. This example had the following differences from Example 1.

3) The polished silica wafer was fed into a low-pressure vapor deposition (LPCVD) apparatus, and 1.4 nm-thick tunnel SiO2 and 50 nm-thick intrinsic polycrystalline silicon poly Si were obtained after deposition.

10) The laser had a power of 10 W.

The other steps were the same as those in Example 1.

Example 3

A solar cell was provided in this example. This example had the following differences from Example 1.

3) The polished silica wafer was fed into a low-pressure vapor deposition (LPCVD) apparatus, and 1.4 nm-thick tunnel $SiO_2$ and 70 nm-thick intrinsic polycrystalline silicon poly Si were obtained after deposition at a temperature of 640° C.

10) The laser had a power of 8 W.

The other steps were the same as those in Example 1.

Example 4

A solar cell was provided in this example. This example had the following differences from Example 1.

3) The polished silica wafer was fed into a low-pressure vapor deposition (LPCVD) apparatus, and 1.4 nm-thick tunnel SiO2 and 70 nm-thick intrinsic polycrystalline silicon poly Si were obtained after deposition at a temperature of 640° C.

10) The laser had a power of 7.5 W.

The other steps were the same as those in Example 1.

Example 5

A solar cell was provided in this example. This example had the following differences from Example 1.

3) The polished silica wafer was fed into a low-pressure vapor deposition (LPCVD) apparatus, and 1.4 nm-thick tunnel SiO2 and 70 nm-thick intrinsic polycrystalline silicon poly Si were obtained after deposition at a temperature of 640° C.

10) The laser had a power of 6 W.

The other steps were the same as those in Example 1.

Example 6

A solar cell was provided in this example. This example had the following differences from Example 1.

3) The polished silica wafer was fed into a low-pressure vapor deposition (LPCVD) apparatus, and 1.4 nm-thick tunnel SiO2 and 70 nm-thick intrinsic polycrystalline silicon poly Si were obtained after deposition at a temperature of 640° C.

10) The laser had a power of 10 W.

The other steps were the same as those in Example 1.

Example 7

A solar cell was provided in this example. This example had the following differences from Example 1.

3) The polished silica wafer was fed into a low-pressure vapor deposition (LPCVD) apparatus, and 1.4 nm-thick tunnel SiO2 and 70 nm-thick intrinsic polycrystalline silicon poly Si were obtained after deposition at a temperature of 640° C.

10) The laser had a power of 12 W.

The other steps were the same as those in Example 1.

Example 8

A solar cell was provided in this example, which was prepared through a process as follows.

1) An N-type silica wafer of 1.3 Ωcm and 166*166 and having a thickness of 165 μm was provided.

2) Polishing and cleaning: The silicon wafer was placed in a tank-type alkaline polishing machine for polishing and cleaning. The working volume of the tank body of the cleaning machine was 360 L. The silicon wafer was pre-cleaned, to remove organic and other contaminants generated during the cutting and transportation of the silicon wafer. In this example, the No. 1 solution for standard RCA cleaning was used for cleaning. The No. 1 solution had a composition of NH4OH—H2O2-H2O, at a volume ratio of 1:1:5. The cleaning temperature was 65° C. The cleaning with an SC-1 reagent was mainly alkaline oxidation, to remove particles on the silicon wafer, and oxidize and remove a small amount of organic matter and metal atom contaminants such as Au, Ag, Cu, Ni, and Cd, Zn, Ca, and Cr on the surface. Water cleaning was then carried out to remove residual chemicals. Next, alkaline polishing treatment was performed, using an alkaline polishing solution containing 5.97% wt KOH, at a temperature of 80° C., for an alkaline polishing treatment time of 300 s, to remove the damage and polish the silicon wafer. Then SC1 cleaning, ozone cleaning, and final acid cleaning and dewatering were performed, to complete the polishing and cleaning.

3) The polished silicon wafer was fed into a low-pressure vapor deposition (LPCVD) apparatus, and 1.4 nm-thick tunnel SiO2 and 90 nm-thick intrinsic polycrystalline silicon poly Si were obtained after deposition. The deposition temperature of tunnel SiO2 was 590° C., and the deposition temperature of intrinsic polycrystalline silicon poly Si was 590° C.

4) The intermediate after the polycrystalline silicon (poly) layer was deposited was placed in a tubular diffusion furnace, BCl3 was introduced, boron doping of the poly Si region and crystallization of poly were completed at 1000° C., to form a P-type crystalline silicon layer n-poly-Si, having a diffusion sheet resistance of 100 Ω/sq. In this process, a BSG layer with a thickness of about 30 nm was formed. It is to be understood that poly Si will transition from a non-crystalline to a crystalline state at a high temperature, and 100% crystallization can be completed here, because of the high temperature for boron diffusion.

5) A SiNx monolayer film with a thickness of 50 nm and a refractive index of 2.4% was deposited on the surface of the P-type crystalline silicon layer p-poly-Si by PECVD, and the SiNx monolayer film was used as a mask layer.

6) The SiNx film in the N region was cut by using a 532 nm green nanosecond laser, to expose the back surface of the silicon wafer.

7) The laser treated silicon wafer was placed in a texturing machine. The working volume of the tank of the machine was 360 L. The main processes and functions were as follows: 1% wt HF at 25° C. was used in a first functional tank to remove the residue. The cleaned silicon wafer was fed to a next texturing tank. The texturing solution was 3.29% wt KOH solution, the texturing temperature was 82° C., and the texturing time was 570 s. Thus, the texturing treatment of the front and back laser-treated regions was completed. Then efficient SC1 cleaning was performed, using a cleaning solution of NH4OH—H2O2-H2O, at a volume ratio of 1:1:5. The cleaning temperature was 65° C., and the cleaning time was 300 s. The pyramid was smoothed using 50 ppm O3 water containing HF, where the concentration of hydrofluoric acid was 0.31% wt. SC2 cleaning was performed to remove metal residues. The cleaning solution was HCL-H2O2-H2O at a volume ratio of 1:1:5, the cleaning temperature was 65° C., and the cleaning time was 200 s. Finally, cleaning with 5% wt hydrofluoric acid was carried out to complete the texturing.

8) A PEALD apparatus was used. An Al2O3 layer was deposited on the front surface, where the deposition temperature was 260° C., the deposition thickness was 10 nm. Then, SiNx was deposited on the Al2O3 layer, where the deposition temperature was 550° C., the deposition thickness was 90 nm, and the refractive index was 2.1%.

Then, the back surface of the silicon wafer with exposed N region was immersed in an HF solution for 30 s.

9) A 15 nm-thick a-si:H (that is, first intrinsic non-crystalline silicon layer i-a-Si) and a 25 nm-thick a-si:H(N) (that is, N-type non-crystalline silicon layer n-a-Si) were sequentially deposited on the back surface by using a CVD apparatus, where the deposition temperature of a-si:H was 200° C., and the deposition temperature of a-si:H(N) was 200° C.

10) One end of the N-type non-crystalline silicon layer n-a-Si away from the N doped region was cut by using a nanosecond laser, to expose the SiNx mask layer. The laser had a power of 8 W.

11) The exposed SiNx mask layer in Step 10) was cleaned with 8% wt hydrofluoric acid, to remove the SiNx mask layer and BSG layer in the grooved region, and expose the P-type crystalline silicon layer p-poly-Si. Meanwhile, after treatment with hydrofluoric acid, part of the SiNx layer was removed, and the thickness of the front SiNx was 80 nm.

12) An indium-tin oxide (ITO) layer was deposited on the back surface, where the thickness was 80 nm.

13) A groove was formed using a 355 nm purple picosecond laser, to expose the SiNx mask layer and form an isolating groove, which insulate the N region and P region, to prevent electric leakage caused by the interconnection of the N/P region. The insulating resistance of the insulated area was tested to be >10 MΩ, and the laser width was 100 μm.

14) A metallized electrode was prepared on the back surface by screen printing using metallic silver, solidified, and annealed.

Comparative Example 1

An HBC solar cell was provided in this comparative example, which was prepared through a process including the following steps:

1) An N-type silica wafer of 1.3 Ωcm and 166*166 and having a thickness of 165 μm was provided.

2) Polishing and cleaning: The silicon wafer was placed in a tank-type alkaline polishing machine for polishing and cleaning. The working volume of the tank body of the cleaning machine was 360 L. The silicon wafer was pre-cleaned, to remove organic and other contaminants generated during the cutting and transportation of the silicon wafer. In this example, the No. 1 solution for standard RCA cleaning was used for cleaning. The No. 1 solution had a composition of NH4OH—H2O2-H2O, at a volume ratio of 1:1:5. The cleaning temperature was 65° C. The cleaning with an SC-1 reagent was mainly alkaline oxidation, to remove particles on the silicon wafer, and oxidize and remove a small amount of organic matter and metal atom contaminants such as Au, Ag, Cu, Ni, and Cd, Zn, Ca, and Cr on the surface. Water cleaning was then carried out to remove residual chemicals. Next, alkaline polishing treatment was performed, using an alkaline polishing solution containing 5.97% wt KOH, at a temperature of 80° C., for an alkaline polishing treatment time of 300 s, to remove the damage and polish the silicon wafer. Then SC1 cleaning, ozone cleaning, and final acid cleaning and dewatering were performed, to complete the polishing and cleaning.

3) A layer of SiNx mask was deposited on the back surface of the silicon wafer by PECVD, where the thickness was 200 nm, and the refractive index was 2.4%.

4) In a tank-type cleaning machine, the silicon wafer was placed in an HF tank containing a 1% wt HF solution, and treated for 30 s at normal temperature, to remove the SiNx plated on the side and front surface of the solar cell. Then the silicon wafer was textured in an alkaline tank, where the texturing solution was a solution containing 2.5% wt KOH+texturing additives, the texturing temperature was 82° C., and the texturing time was 780 s. Next, the textured surface was smoothed in a HNO3/HF tank containing a solution of HNO3 and HF at a volume ratio of 1:100, where the total etching amount was 1.8 g. The front surface is caused to have a reflectivity of 12% and a large microscopic texture structure in which the textured pyramid has a size of 4 μm. Finally, the silica wafer was treated in an 8% wt HF tank at room temperature for 300 s, to remove the SiNx mask remaining on the back surface completely.

5) 15 nm-thick intrinsic a-si:H, 25 nm-thick phosphorus-doped a-si:H(N), 200 nm-thick SiNx layer and 15 nm-thick intrinsic a-si:H were sequentially deposited by CVD on the back surface of the silicon wafer.

6) The outermost intrinsic a-si:H on the back surface was grooved by laser, to expose a P+ region, which was a region for depositing intrinsic a-si:H and a-si:H(P) in subsequent steps.

7) In a tank-type cleaning machine, the silicon wafer was placed in an HF tank containing a 8% wt HF solution, and treated for 200 s, to remove SiNx from the region grooved by laser. Then the silicon wafer was etched in an alkaline tank, where the solution was 0.5 wt % KOH+0.15 wt % H2O2, the solution temperature was 25° C., and the etching time was 400 s, to remove the remaining intrinsic a-si:H and phosphorus-doped a-si:H(N) layer.

8) 15 nm-thick intrinsic a-si:H and 25 nm-thick B-doped a-si:H(P) were sequentially doped on the back surface of the silicon wafer by CVD.

9) 15 nm-thick intrinsic a-si:H and 85 nm-thick SiNx layer were sequentially deposited on the front surface of the silicon wafer by CVD.

10) The intrinsic a-si:H and a-si:H(P) in an N+ region on the back surface was etched by laser having a power of 6 W.

11) The SiNx layer exposed in the N+ region after laser treatment was removed using an HF solution having a concentration of 8% wt, for a period of time of 400 s, to expose the phosphorus-doped a-si:H(N) layer.

12) An indium-tin oxide (ITO) layer was deposited on the back surface, where the thickness was 80 nm.

13) A groove was formed using a 355 nm purple pico-second laser, to expose the SiNx mask layer and form an isolating groove, which insulate the N region and P region, to prevent electric leakage caused by the inter-connection of the N/P region. The insulating resistance of the insulated area was tested to be >10 MΩ, and the laser width was 100 μm.

14) A metallized electrode was prepared on the back surface by screen printing using metallic silver, solidi-fied, and annealed.

Comparative Example 2

An HBC solar cell was provided in this comparative example, which was prepared through a process including the following steps:

10) The intrinsic a-si:H and a-si:H(P) in an N+ region on the back surface was etched by laser having a power of 8 W.

The other steps were the same as those in Comparative Example 1.

Comparative Example 4

An HBC solar cell was provided in this comparative example, which was prepared through a process including the following steps:

10) The intrinsic a-si:H and a-si:H(P) in an N+ region on the back surface was etched by laser having a power of 10 W.

The other steps were the same as those in Comparative Example 1.

Comparative Example 5

An HBC solar cell was provided in this comparative example, which was prepared through a process including the following steps:

10) The intrinsic a-si:H and a-si:H(P) in an N+ region on the back surface was etched by laser having a power of 12 W.

The other steps were the same as those in Comparative Example 1.

The energy conversion efficiency Eta, the open-circuit voltage Uoc, the short-circuit current Isc, and the filling factor FF of the solar cell prepared in Examples 1-4 and Comparative Example 1 were tested. The results are shown in Table 1.

TABLE 1

| | Eta (%) | Uoc (V) | Isc (A) | FF (%) | Width of orthogonal projection of textured pyramid on front surface (μm) | Reflectivity of front surface (%) | Laser powder in N+ region (w) |
|---|---|---|---|---|---|---|---|
| Example 1 | 25.94 | 0.735 | 11.63 | 83.2 | 2 | 10 | 12 |
| Example 2 | 26.15 | 0.733 | 11.70 | 83.6 | 2 | 10 | 10 |
| Example 3 | 26.06 | 0.734 | 11.67 | 83.4 | 2 | 10 | 8 |
| Example 4 | 26.10 | 0.742 | 11.59 | 83.5 | 2 | 10 | 7.5 |
| Example 5 | 26.12 | 0.741 | 11.60 | 83.5 | 2 | 10 | 6 |
| Example 6 | 26.11 | 0.742 | 11.63 | 83.3 | 2 | 10 | 10 |
| Example 7 | 26.09 | 0.739 | 11.64 | 83.2 | 2 | 10 | 12 |
| Example 8 | 26.11 | 0.740 | 11.62 | 83.4 | 2 | 10 | 8 |
| Comparative Example 1 | 25.95 | 0.740 | 11.60 | 83.5 | 4 | 12 | 6 |
| Comparative Example 2 | 25.90 | 0.741 | 11.56 | 83.3 | 4 | 12 | 7.5 |
| Comparative Example 3 | 25.12 | 0.725 | 11.30 | 83.0 | 4 | 12 | 8 |
| Comparative Example 4 | 24.62 | 0.712 | 11.05 | 82.8 | 4 | 12 | 10 |
| Comparative Example 5 | 23.86 | 0.705 | 11.02 | 82.5 | 4 | 12 | 12 |

10) The intrinsic a-si:H and a-si:H(P) in an N+ region on the back surface was etched by laser having a power of 7.5 W.

The other steps were the same as those in Comparative Example 1.

Comparative Example 3

An HBC solar cell was provided in this comparative example, which was prepared through a process including the following steps:

It can be seen that patternization is achieved by perform-ing masking and demasking techniques for many times in Comparative Examples 1-5, so the production cost is high, and the process control difficulty is high, a tunnel SiO2 layer+N-type crystalline silicon layer n-poly-Si passivated contact is used in Examples 1-8 to replace an intrinsic a-si:H+a-si:H(N) film for passivation in Comparative Example 1. Since the tunnel SiO2 layer+N-type crystalline silicon layer n-poly-Si in Examples 1-8 is less sensitive to laser-induced thermal damage, in this step, a laser cutting process can be directly performed, without patternization by performing masking and demasking techniques for many times. A higher efficiency is achieved at a lower laser power in Comparative Examples 1-2. However, at a higher laser power, obvious reduction in efficiency is shown in Comparative examples 3-5. It can be seen that the tunnel SiO2 layer+N-type crystalline silicon layer n-poly-Si is less sensitive to laser-induced thermal damage, the impact on the passivation effect of a doped region corresponding to the first region can be reduced during laser cutting process. As can be further seen from Table 1, compared with Comparative Example 1-2, the energy conversion efficiency Eta, the open-circuit voltage Uoc, and the filling factor FF of the solar cells in Examples 1-8 reach levels comparable to those in Comparative Examples 1-2. Compared with Comparative Examples 1-2, the reflectivity of the front surface in Examples 1-8 is obviously reduced, resulting in a high average efficiency and short-circuit current Isc in Examples 1-8 than those in Comparative Examples 1-2.

In another aspect of the present disclosure, the present application provides a back-contact solar cell. According to an embodiment of the present disclosure, referring to FIG. 10, the back-contact solar cell includes: a semiconductor substrate 3, where the semiconductor substrate 3 has a first surface 3-1 and a second surface 3-2 opposite to each other, the first surface 3-1 includes multiple non-recessed regions (regions B) and multiple recessed regions (regions C), the non-recessed regions (region B) and recessed regions (regions C) are alternately arranged on the first surface 3-1, and a distance from the non-recessed region to a center line of the semiconductor substrate in a width direction is larger than a distance from the recessed region to the center line of the semiconductor substrate in the width direction; a tunnel oxide layer 4 and an N-type doped crystalline silicon layer 5, the tunnel oxide layer 4 is provided on the non-recessed region (region B), and the N-type doped crystalline silicon layer 5 is located on a surface of the tunnel oxide layer 4 away from the semiconductor substrate 3; a first intrinsic non-crystalline silicon layer 8 and a P-type doped non-crystalline silicon layer 9, where the N-type doped crystalline silicon layer 5 and the P-type doped non-crystalline silicon layer 9 have opposite conductivity types, the first intrinsic non-crystalline silicon layer 8 is located on the recessed region (region C) and extends on part of a surface of the N-type doped crystalline silicon layer 5 away from the tunnel oxide layer 4, and the P-type doped non-crystalline silicon layer 9 is located on a surface of the first intrinsic non-crystalline silicon layer 8 away from the semiconductor substrate 3, to form an staggered-lamination region of the first intrinsic non-crystalline silicon layer 8 and the P-type doped non-crystalline silicon layer 9 with the tunnel oxide layer 4 and the P-type doped polycrystalline silicon layer; an isolating structure, where the isolating structure includes an isolating layer and an isolating groove 13, the isolating layer is located between the first intrinsic non-crystalline silicon layer 8 and the N-type doped crystalline silicon layer 5 in the staggered-lamination region, and the isolating groove 13 penetrates through the P-type doped non-crystalline silicon layer 9 and the first intrinsic non-crystalline silicon layer 8 in the staggered-lamination region. Therefore, compared with a HBC solar cell structure in related art, a tunnel oxide layer+n-poly-Si layer passivated contact is used in the present application to replace an intrinsic a-Si:H+a-Si:H(N) film for passivation in the existing HBC solar cell structure. Since the tunnel oxide layer+n-poly-Si layer is less sensitive to laser-induced thermal damage, the impact on the passivation effect of an N region can be reduced during a laser cutting process, thus further broadening the process window, and reducing the process difficulty. Compared with a TBC solar cell structure in related art, an intrinsic non-crystalline silicon layer i-a-Si+p-a-Si layer passivated contact is used in the present disclosure to replace SiOx+p-poly-Si in the existing TBC solar cell structure. By means of this, the problem of serious concentric circles on a silicon wafer due to two high-temperature processes of p poly and n poly in the TBC solar cells is avoided, to improve the surface passivation effect of a P region, and improve the electrical performance of the solar cell. Therefore, in the present application, the process window for preparing the back-contact solar cell is broadened, the process difficulty is reduced, and the surface passivation effect of the P region is improved. Therefore, the energy conversion efficiency Eta, the open-circuit voltage Uoc, the short-circuit current Isc, the filling factor FF, and the parallel resistance Rsh reach levels comparable to those of an existing HBC solar cell structure.

In an embodiment of the present application, a distance from the non-recessed region to a center line of the semiconductor substrate in a width direction is larger than a distance from the recessed region to the center line of the semiconductor substrate in the width direction. That is, the recessed region (region C) is recessed into the non-recessed region (region B). The reason is that in the preparation process of the back-contact solar cell, the recessed region (region C) is textured by etching, to form the recess in the recessed region (region C). Therefore, the boundary area between the recessed region (region C) and the non-recessed region (region B) is discontinuous. For example, the recessed region (region C) and the non-recessed region (region B) are staggered in an up-down direction. An interface between the recessed region (region C) and the non-recessed region (region B) is oblique (that is, the edge of the recessed regions in contact with the non-recessed region is oblique). The reason is that a wet process is used for local texturing, causing the laser treated region to recess, and forming a texture.

Figure 10:
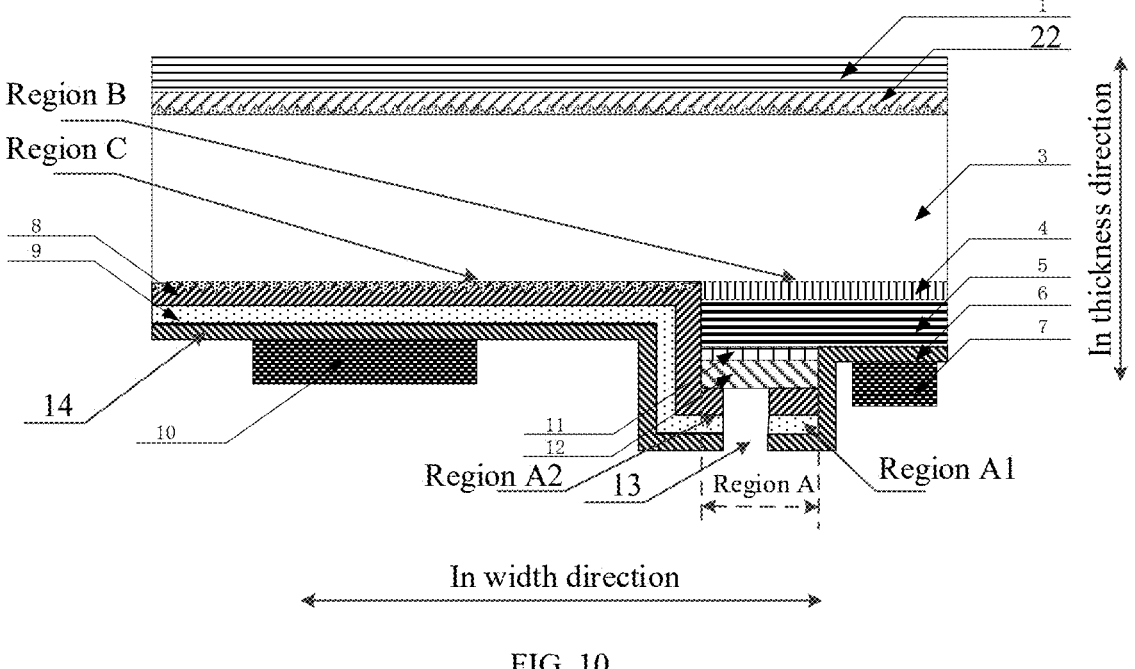
FIG. 10 is a schematic structural view of a back-contact solar cell according to another embodiment of the present application.

It is to be understood that the back-contact solar cell includes multiple non-recessed regions (regions B) and multiple recessed regions (region C), and the non-recessed regions (region B) and recessed regions (regions C) are alternately arranged on the first surface. Only one non-recessed region (region B) and one recessed region (region C) are schematically shown in FIG. 10.

In an embodiment of the present application, the semiconductor substrate 3 may be made of silicon (Si) or germanium (Ge) and the like, or gallium arsenide (GaAs) and the like. It is to be understood that the first surface 3-1 of the semiconductor substrate 3 means a back surface, and the second surface 3-2 of the semiconductor substrate 3 means a light receiving surface.

In an embodiment of the present application, the specific type of the tunnel oxide layer 4 is not particularly limited. As a specific example, the tunnel oxide layer 4 is a tunnel SiO2 layer. According to some specific embodiments of the present application, the tunnel oxide layer 4 has a thickness of 1 to 4 nm (for example 1/1.8/2/3/4 nm), and preferably 1 to 1.8 nm. By defining the thickness of the tunnel oxide layer 4 within the above range, a good surface passivation effect can be further ensured, and a majority carrier tunnel effect is guaranteed.

According to some specific embodiments of the present application, the N-type doped crystalline silicon layer 5 has a thickness of 30 to 250 nm (for example, 30/50/100/150/200/250 nm), and preferably 40 to 200 nm. By defining the thickness of the N-type doped crystalline silicon layer 5 within the above range, the poly thickness is reduced as much as possible to reduce the parasitic absorption, while a good field passivation effect is ensured.

According to some embodiments of the present application, the phosphorus concentration doped in the N-type doped crystalline silicon layer 5 is 8E19 to 5E20 cm–3 (for example, 8E19/9E19/1E20/2E20/3E20/4E20/5E20 cm–3), and preferably 3 to 9E20 cm–3. By defining the phosphorus concentration doped in the N-type doped crystalline silicon layer 5 within the above range, a contact performance between a metal slurry and poly in a subsequent step is further improved, while a good field passivation effect is ensured.

According to some specific embodiments of the present application, the first intrinsic non-crystalline silicon layer 8 has a thickness of 10 to 20 nm, for example, 10/11/12/13/14/15/16/17/18/19/20 nm. By defining the thickness of the first intrinsic non-crystalline silicon layer 8 within the above range, a good passivation effect is achieved on the surface of the silicon substrate.

According to some specific embodiments of the present application, the P-type doped non-crystalline silicon layer 9 has a thickness of 5 to 45 nm (for example, 5/10/20/30/40/45 nm), and preferably 10 to 20 nm. By defining the thickness of the P-typed doped non-crystalline silicon layer 9 within the above range, the subsequent laser treatment and cleaning steps can be facilitated.

According to some specific embodiments of the present application, the boron concentration doped in the P-type doped non-crystalline silicon layer 9 is 10e20 cm–3 to 10e21 cm–3; (for example, 1/2/3/4/5/6/7/8/9/10e21 cm–3). By defining the boron concentration doped in the P-type doped non-crystalline silicon layer 9 within the above range, good contact performance is achieved while the passivation effect is ensured.

According to some specific embodiments of the present application, the semiconductor substrate is an N-type semiconductor substrate, and the recessed region has a size in a width direction that is greater than the size of the non-recessed region in the width direction. Alternatively, the semiconductor substrate is a P-type semiconductor substrate, and the recessed region has a size in a width direction that is less than the size of the non-recessed region in the width direction. Therefore, the series resistance of the back-contact solar cell is further reduced, and the filling factor of the back-contact solar cell is larger.

According to some specific embodiments of the present application, the isolating layer includes an insulating layer 12, where the insulating layer 12 is located between the first intrinsic non-crystalline silicon layer and the N-type doped crystalline silicon layer. In some examples, the insulating layer 12 may be a mask protective layer. The isolating groove 13 penetrates through the first intrinsic non-crystalline silicon layer 8 and the P-type doped non-crystalline silicon layer 9 and extends to the mask protective layer. The mask protective layer, as a laser energy absorption layer, has the effect of reducing the impact of the laser cutting process on the passivation effect in the doped region corresponding to the non-recessed region, and the effect of providing a hydrogen source to further passivate the polycrystalline silicon and the substrate, thus improving the passivation effect, and protecting the N-type doped crystalline silicon layer 5 from alkali corrosion in the texturing process. It is to be understood that the isolating groove may penetrate through the insulating layer 12, or may not penetrate through the insulating layer 12.

According to some specific embodiments of the present application, the isolating layer includes an insulating layer 12 (for example, silicon nitride layer) and a PSG layer 11, where the PSG layer 11 is provided on the surface of the N-type doped crystalline silicon layer away from the tunnel oxide layer, and the insulating layer 12 is provided on a surface of the PSG layer 11 away from the N-type doped crystalline silicon layer. In some examples, the isolating layer includes at least one of a silicon nitride layer, an aluminum nitride layer, a silica layer and a PSG layer. It is to be understood that the PSG layer 11 is naturally formed in the presence of oxygen during the process of phosphorus doping of the N-type doped crystalline silicon layer 5, and has a thickness of 25 to 35 nm, and a composition of silica doped with phosphorus. Similarly, the isolating groove may penetrate through the insulating layer 12 and the PSG layer 11, or may not penetrate through the insulating layer 12 and the PSG layer 11.

In an embodiment of the present application, the specific type of the mask protective layer is not particularly limited. As some specific examples, the mask protective layer may be a SiNx layer. In some examples, the mask protective layer may have a thickness of 50 to 110 nm, whereby the above effect of the mask protective layer is further ensured. In some examples, the reflectivity of the mask protective layer may be 1.8 to 2.6%, and preferably 2.2 to 2.4%. Therefore, the above effect of the mask protective layer is further ensured.

Further, referring to FIG. 10, the back-contact solar cell further includes: a first electrode layer 14 and a second electrode layer 6. The first electrode layer 14 is located at one side of the isolating groove, and the first electrode layer 14 covers the P-type doped non-crystalline silicon layer. The second electrode layer 6 is located at the other side of the isolating groove, and the second electrode layer 6 covers the P-type doped non-crystalline silicon layer and the N-type doped crystalline silicon layer. The first electrode layer 14 enhances the conductivity between the P-type doped non-crystalline silicon layer 9 and a first grid line 10, and the second electrode layer 6 enhances the conductivity between the N-type doped crystalline silicon layer 5 and a second grid line 7.

In an embodiment of the present application, the first electrode layer 14 and the second electrode layer 6 are transparent conductive layers. The specific materials of the first electrode layer 14 and the second electrode layer 6 are not particularly limited. As some specific examples, the materials of the first electrode layer 14 and the second electrode layer 6 are each independently at least one selected from indium-tin oxide, aluminum zinc oxide, hydrogen doped indium oxide, and indium-tungsten oxide. In some examples, the first electrode layer 14 and the second electrode layer 6 each independently have a thickness of 50 to 110 nm.

Further, referring to FIG. 10, the back-contact solar cell further includes: a passivation layer. The passivation layer includes a second intrinsic non-crystalline silicon layer 22 and a silicon nitride passivation layer 1. The second intrinsic non-crystalline silicon layer 22 is provided on the second surface 3-2, and the silicon nitride passivation layer 1 is provided on a surface of the oxide passivation layer away from the semiconductor substrate 3. The silicon nitride passivation layer 1 can function as an anti-reflection film and a protective film, and also as a passivation film to inhibit the recombination of photocarriers. The second intrinsic non-crystalline silicon layer 22 has the function of inhibiting the recombination of photocarriers at a bond interface with the second surface 3-2. In some examples, at least part of the second surface 3-2 is provided with a texture structure. That is, at least part of the second surface 3-2 is provided with multiple pyramidal structures. Therefore, the light receiving surface of the second surface 3-2 is enlarged. In some examples, the non-recessed region has a texture structure; and/or, the recessed region has a texture structure. The texture structures in the non-recessed region and the recessed region are formed in the cleaning step in the preparation process of the back-contact solar cell.

In another aspect of the present application, the present application provides a method for preparing a back-contact solar cell. According to an embodiment of the present disclosure, the method includes the following steps.

S100: A semiconductor substrate is provided.

In this step, a semiconductor substrate 3 is provided, where the semiconductor substrate 3 has a first surface 3-1 and a second surface 3-2 opposite to each other, and the first surface includes multiple first regions and multiple second regions arranged alternately, as shown in FIG. 2. The first surface 3-1 of the semiconductor substrate 3 means a back surface, and the second surface 3-2 of the semiconductor substrate 3 means a light receiving surface. In an embodiment of the present application, the semiconductor substrate 3 may be made of silicon (Si) or germanium (Ge) and the like, or gallium arsenide (GaAs) and the like.

To ensure the cleanliness of the semiconductor substrate 3, in some examples, the semiconductor substrate 3 is polished and cleaned. Specifically, the semiconductor substrate 3 is put into a tank-type polishing and cleaning machine for polishing. The cutting damage layer on the surface of the semiconductor substrate 3 is removed, and the preparation of double-sided micro-morphology is completed. By controlling the concentration of the cleaning solution (generally an alkaline liquor, e.g., potassium hydroxide/sodium hydroxide solution), the temperature and the cleaning time, the size of the polished square block can be adjusted.

S200: A tunnel oxide layer, an N-type doped crystalline silicon layer, and an isolating layer are sequentially formed on the first surface.

In this step, a tunnel oxide layer 4 and an intrinsic or in-situ doped poly Si are prepared by low-pressure chemical vapor deposition (LPCVD), PECVD, PVD, PEALD or the like. The tunnel oxide layer 4 and the polycrystalline silicon (poly) are preferably deposited on the back surface by LPCVD at 600-800° C. An intrinsic a-Si:H+a-Si:H(N) film in the existing HBC solar cell structure is often deposited by using an expensive CVD apparatus. In the present application, a cheap LPCVD apparatus is used to replace the expensive CVD apparatus, thus greatly reducing the equipment investment cost.

Then an intermediate after the polycrystalline silicon (poly) layer is deposited is placed in a tubular diffusion furnace, a phosphorus-containing compound (such as phosphorus oxychloride) is introduced, and the polycrystalline silicon is converted into an N-type doped crystalline silicon layer 5 at a high temperature of 750-880° C. It is to be understood that a PSG layer 11 is naturally formed in the presence of oxygen in the phosphorus doping process of poly-Si, and has a thickness of about 25 to 35 nm, and the PSG layer 11 has the effect of strengthening the mask. In some examples, the phosphorus concentration doped in the N-type doped crystalline silicon layer 5 is 8E19 to 5E20 cm−3 (for example, 8E19/9E19/1E20/2E20/3E20/4E20/5E20 cm−3), and preferably 3 to 9E20 cm−3. In some examples, the N-type doped crystalline silicon layer 5 has a thickness of 30 to 250 nm, and preferably 40 to 200 nm. In some examples, the tunnel oxide layer 4 has a thickness of 1 to 4 nm, and preferably 1 to 1.8 nm.

In an embodiment of the present application, the specific type of the tunnel oxide layer 4 is not particularly limited. For example, the tunnel oxide layer 4 is a tunnel $SiO_2$ layer.

Finally, an insulating layer is formed on the surface of the PSG layer. In some examples, the insulating layer may be a mask protective layer. The mask protective layer is deposited by PECVD at a temperature of 400-600° C. The mask protective layer, as a laser energy absorption layer, has the effect of reducing the impact of the laser cutting process on the passivation effect in an N region, and the effect of providing a hydrogen source to further passivate the polycrystalline silicon and the substrate, thus improving the passivation effect, and protecting the N-type doped crystalline silicon layer 5 from alkali corrosion in the texturing process. The intermediate prepared in S200 has a structure as shown in FIG. 3.

In an embodiment of the present application, the specific type of the mask protective layer is not particularly limited. For example, the mask protective layer may be a SiNx layer. In some examples, the thickness of the mask protective layer may be 50 to 110 nm. Therefore, the effect of the mask protective layer 12 is further ensured. In some examples, reflectivity of the mask protective layer may be 1.8 to 2.6%, and preferably 2.2 to 2.4%. Therefore, the above effect of the mask protective layer is further ensured.

S300: The isolating layer in the second region is cut by laser.

In this step, the isolating layer in the second region is cut by laser, to expose the semiconductor substrate in the second region, and leave over the tunnel oxide layer and the N-type doped crystalline silicon layer in the first region. The structure is as shown in FIG. 4. A tunnel oxide layer 4+ n-poly-Si layer passivated contact is used in the present application to replace an intrinsic a-Si:H+a-Si:H(N) film for passivation in the existing HBC solar cell structure. Since the tunnel oxide layer 4+ n-poly-Si layer is less sensitive to laser-induced thermal damage, in this step, a laser cutting process can be directly performed. The impact on the passivation effect of an N region can be reduced during laser cutting process, thus further broadening the process window, and reducing the process difficulty. In the existing HBC solar cell structure, patternization is generally performed by largely using masking and demasking techniques in this step, the production cost is high, and the process control difficulty is high. In the present application, the steps of masking and demasking in the laser cutting process are omitted in this step, thus improving the production efficiency.

S400: A first intrinsic non-crystalline silicon layer and a P-type doped non-crystalline silicon layer are sequentially formed on a surface of the intermediate prepared in Step S300 away from the second surface.

In this step, a first intrinsic non-crystalline silicon layer 8 and a P-type doped non-crystalline silicon layer 9 are sequentially formed on a surface of the intermediate prepared in Step S300 away from the second surface 3-2 by CVD at 220-300° C. An intrinsic non-crystalline silicon layer i-a-Si+p-a-Si layer passivated contact is used in the present disclosure to replace SiOx+p-poly-Si in the existing TBC solar cell structure, to improve the surface passivation effect of the P region and improve the electrical performance of the solar cell. In some examples, the first intrinsic non-crystalline silicon layer 8 has a thickness of 10 to 20 nm. In some examples, the P-type doped non-crystalline silicon layer 9 has a thickness of 5 to 45 nm, and preferably 10 to 20 nm.

Figure 11:
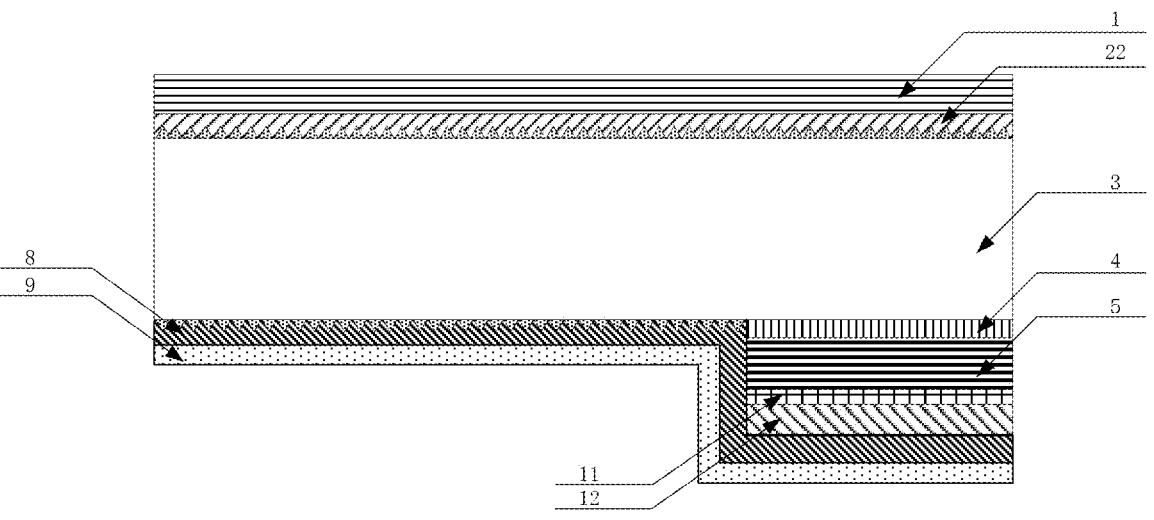
FIG. 11 is a schematic structural view of an intermediate in a process of preparing a back-contact solar cell according to an embodiment of the present application.

According to a specific embodiment of the present disclosure, Step S400 further includes: a second intrinsic non-crystalline layer and a silicon nitride passivation layer 1 are sequentially formed on second surface 3-2. The prepared intermediate is shown in FIG. 11. The silicon nitride passivation layer 1 can function as an anti-reflection film and a protective film, and also as a passivation film to inhibit the recombination of photocarriers. The second intrinsic non-crystalline silicon layer 22 has the function of inhibiting the recombination of photocarriers at a bond interface with the second surface 3-2.

Further, between Steps S300 and S400, the method further includes: alkaline texturing the surface of the intermediate prepared in Step S300 to form a pyramidal texture structure on the second surface and in the second region, and removing the mask protective layer, the tunnel oxide layer 4 or the N-type doped crystalline silicon layer 5 remaining in the second region after laser treatment. The cleaning solution may be an acid solution, for example, hydrofluoric acid. Specifically, the intermediate after Step S300 is sequentially placed in a hydrofluoric acid tank, a texturing tank, an SC1 cleaning tank, a CP smoothing groove, an SC2 cleaning tank and an acid cleaning tank. The hydrofluoric acid tank is used to remove the mask protective layer 12, the tunnel oxide layer 4 or the N-type doped crystalline silicon layer 5 remaining in the second region after laser treatment. The texturing groove is used to carry out texturing in the laser treated region and region of the second surface 3-2 at the same time. The SC1 cleaning tank is mainly used to remove the contaminant and chemical residue on the surface of the intermediate. The CP smoothing groove is used to smooth the top and bottom of the pyramid, to prevent the deposition and epitaxial growth of non-crystalline silicon. The SC2 cleaning tank is used to remove the metal residue on the silicon wafer. The acid cleaning tank is used for chemical passivation of the intermediate, to form a hydrophobic structure. Therefore, the removal of the residue in the second region after laser cutting and the texturing of the second region are completed in this step, causing the laser treated region to recess and form a texture. The texturing of the second surface 3-2 is also completed in this step, as shown in FIG. 5. The textured second region is a recessed region, and the first region is a non-recessed region.

In some examples, the preparation of the silicon nitride passivation layer 1 may involve the preparation of multiple sub-silicon nitride passivation layers 1. For example, the multiple sub-silicon nitride passivation layers 1 can be designed to have a first film layer with a thickness of 20±3 nm and a refractive index of 2.4%, a second film layer with a thickness of 15±5 nm and a refractive index of 2.2%, a third film layer with a thickness of 40±5 nm and a refractive index was 2.0%, a fourth sacrificial layer with a thickness of 80±10 nm and a refractive index of 2.4%. The function of the fourth sacrificial layer is that the sacrificial layer will inevitably be lost in the process of alkaline texturing of the intermediate prepared in Step S300, and the total thickness of the remaining first layer, second layer and the third layer is the thickness of the final silicon nitride passivation layer 1.

S500: Parts of the first intrinsic non-crystalline silicon layer, the P-type doped non-crystalline silicon layer and the isolating layer are removed.

In this step, parts of the first intrinsic non-crystalline silicon layer, the P-type doped non-crystalline silicon layer and the isolating layer at one end away from the second region are removed, to leave over the first intrinsic non-crystalline silicon layer and the P-type doped non-crystalline silicon layer staggered with the tunnel oxide layer and the N-type doped crystalline silicon layer, and form an staggered-lamination region.

Figure 12:
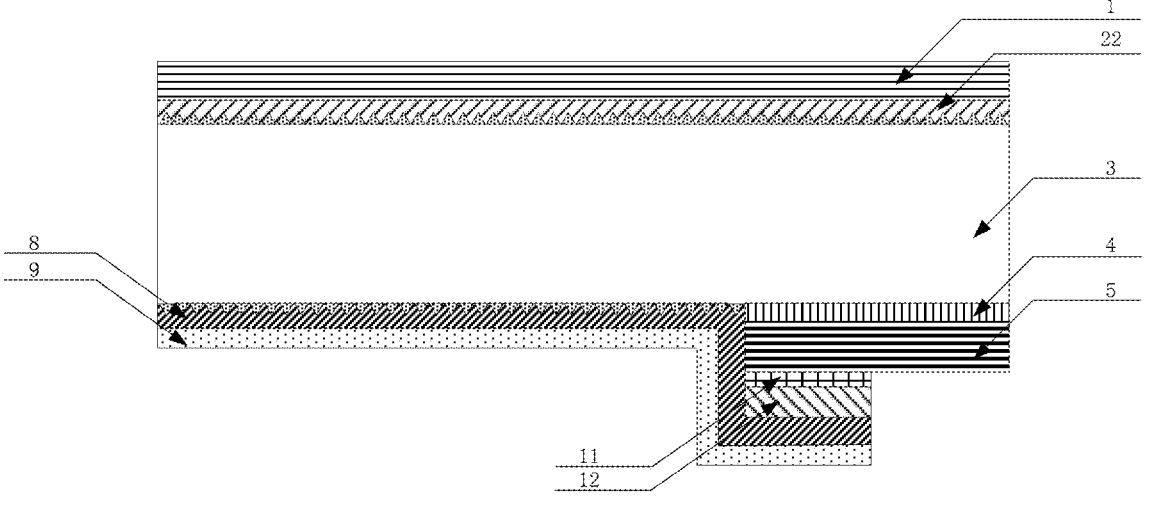
FIG. 12 is a schematic structural view of an intermediate in a process of preparing a back-contact solar cell according to an embodiment of the present application.

Specifically, parts of the first intrinsic non-crystalline silicon layer and the P-type doped non-crystalline silicon layer at one end away from second region are removed by laser, to expose the isolating layer. In some examples, this step can be completed by using 532 nm green nanosecond or 355 nm UV nanosecond-picosecond laser. In some examples, the laser has a power of 6-15 W. Then, the exposed isolating layer is removed by an acid solution (such as HF solution), to expose the remaining N-type doped crystalline silicon layer 5, leave over the first intrinsic non-crystalline silicon layer 8 and the P-type doped non-crystalline silicon layer 9 staggered with the tunnel oxide layer 4 and the N-type doped crystalline silicon layer 5, and form an staggered-lamination region (region A). The structure of the intermediate is shown in FIG. 12. Step S500 aims to expose part of the N-type doped crystalline silicon layer 5 in the grooved region, to facilitate the subsequent steps to prepare the second electrode layer and the second grid line.

S600: A groove is formed in the staggered-lamination region.

Figure 14:
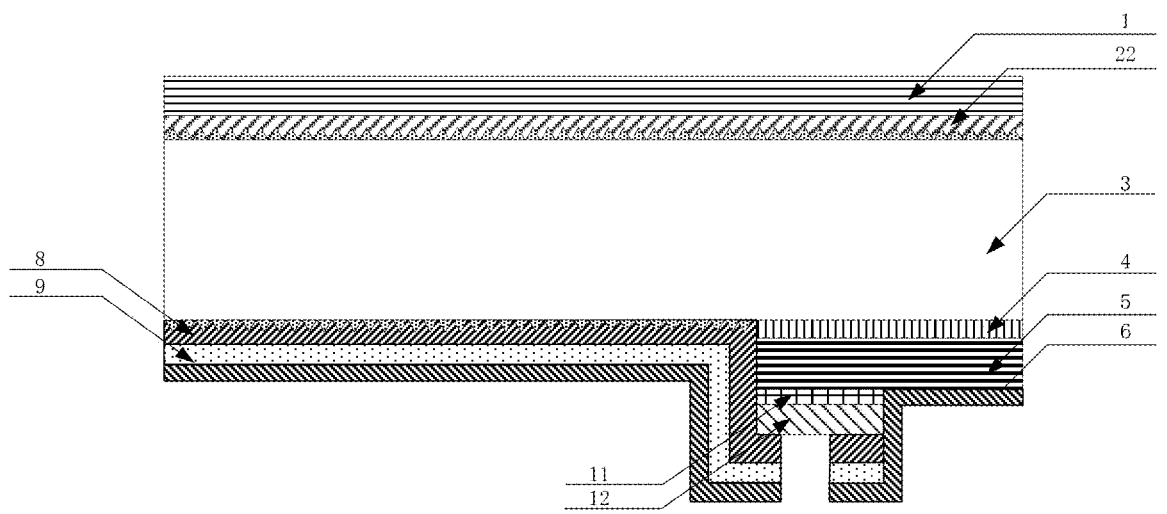
FIG. 14 is a schematic structural view of an intermediate in a process of preparing a back-contact solar cell according to an embodiment of the present application.

In this step, a groove is formed in the staggered-lamination region (region A) by laser ablation, to expose part of the isolating layer and form an isolating groove 13. The isolating groove 13 divides the stacked region (region A) into a first staggered-lamination region (region A1) and a second staggered-lamination region (region A2). The structure of the intermediate is shown in FIG. 14. In some examples, the isolating groove 13 has a width of 20-200 μm, and preferably 80-120 μm.

Figure 13:
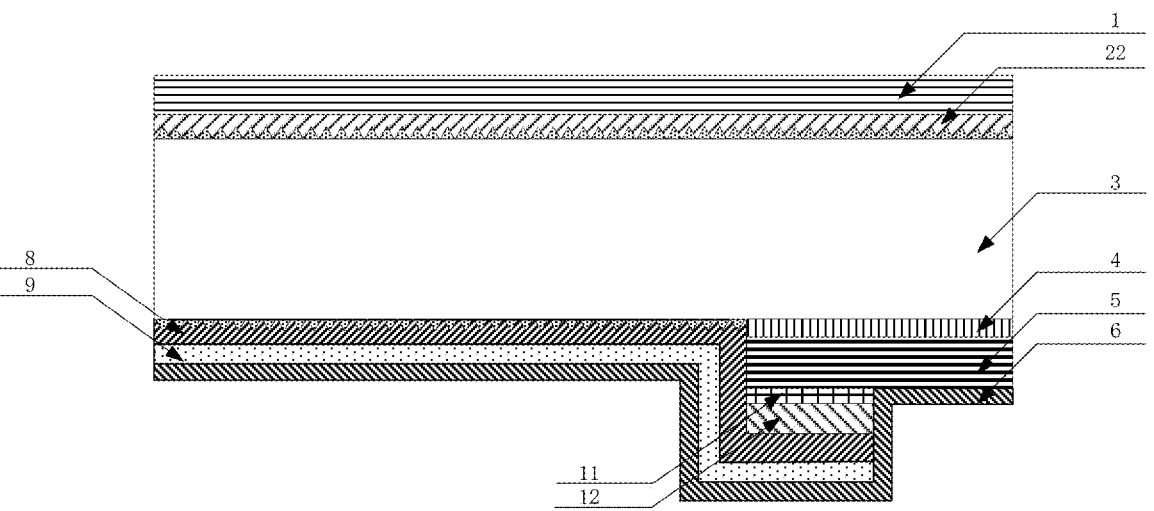
FIG. 13 is a schematic structural view of an intermediate in a process of preparing a back-contact solar cell according to an embodiment of the present application.

Further, after a groove is formed in the staggered-lamination region, the method further includes: forming a first electrode layer at one side of the isolating groove, where the first electrode layer covers the P-type doped non-crystalline silicon layer; and forming a second electrode layer at the other side of the isolating groove, where the second electrode layer covers the P-type doped non-crystalline silicon layer and the N-type doped crystalline silicon layer. The first electrode layer enhances the conductivity between the P-type doped non-crystalline silicon layer 9 and a first grid line 10, and the second electrode layer enhances the conductivity between the N-type doped crystalline silicon layer 5 and a second grid line 7. In some embodiments, an electrode layer can be formed on the surface of the P-type doped non-crystalline silicon layer (the structure of the intermediate is as shown in FIG. 13), and then a groove is formed in the staggered-lamination region.

In an embodiment of the present application, the first electrode layer and the second electrode layer are transparent conductive layers. The specific materials of the first electrode layer and the second electrode layer are not particularly limited. As some specific examples, the materials of the first electrode layer and the second electrode layer are each independently at least one selected from indium-tin oxide, aluminum zinc oxide, hydrogen doped indium oxide, and indium-tungsten oxide. In some examples, the first electrode layer and the second electrode layer each independently have a thickness of 50 to 110 nm.

Further, the method further includes: forming a first grid line 10 on part of a surface of the first electrode layer 14, and forming a second grid line 7 on part of the surface of the second electrode layer 6. Specifically, the first grid line is formed on part of the surface of the first electrode layer, and the second grid line is formed on part of the surface of the second electrode layer, by screen printing, inkjet printing, laser transfer printing, chemical plating, electroplating, or PVD.

In the method according to the embodiment of the present application, compared with a process for preparing a HBC solar cell in related art, a tunnel oxide layer+n-poly-Si layer passivated contact is used in the method to replace an intrinsic a-si:H+a-si:H(N) film for passivation in the existing HBC solar cell structure. Since the tunnel oxide layer+n-poly-Si layer is less sensitive to laser-induced thermal damage, a laser cutting process can be directly performed in Step S300. The impact on the passivation effect of an N region can be reduced during laser cutting process, thus further broadening the process window; and reducing the process difficulty. In the existing HBC solar cell structure, patternization is generally performed by largely using masking and demasking techniques in this step, the production cost is high, and the process control difficulty is high. A region for forming the first doped region can be formed by laser in the present application Compared with a process for preparing a TBC solar cell in related art, an intrinsic non-crystalline silicon layer i-a-Si+p-a-Si passivated contact is used in the method to replace SiOx+p-poly-Si in the existing TBC solar cell structure. By means of this, the problem of serious concentric circles on a silicon wafer due to two high-temperature processes of p poly and n poly in the TBC solar cells is avoided, to improve the surface passivation effect of a P region, and improve the electrical performance of the solar cell. Therefore, by combining passivation with the tunnel oxide layer+n-poly-Si layer and passivation with the intrinsic non-crystalline silicon layer i-a-Si+p-a-Si layer in the method, the process window for preparing the back-contact solar cell is broadened, the process difficulty is reduced, and the surface passivation effect of the P region is improved. Therefore, the energy conversion efficiency Eta, the open-circuit voltage Uoc, the short-circuit current Isc, the filling factor FF, and the parallel resistance Rsh reach levels comparable to those of an existing HBC solar cell structure. In addition, during the deposition of the tunnel oxide layer and the N-type doped crystalline silicon layer n-poly-Si, a cheap LPCVD apparatus is used to replace the expensive CVD apparatus, thus greatly reducing the equipment investment cost. In addition, by combining a texturing process and local etching, a previous texturing process is omitted.

Embodiments of the present disclosure are described in detail below. It is to be understood that the examples described below are exemplary and only used to explain the present application, and should not be construed as a limitation on the present application.

Example 9

A solar cell was provided in this example, which was prepared through a process as follows.

1) An N-type silica wafer of 1.3 Ωcm and 166*166 and having a thickness of 165 μm was provided.

2) Polishing and cleaning: The silicon wafer was placed in a tank-type alkaline polishing machine for polishing and cleaning. The working volume of the tank body of the cleaning machine was 360 L. The silicon wafer was pre-cleaned, to remove organic and other contaminants generated during the cutting and transportation of the silicon wafer. In this example, a standard RCA cleaning solution was used for cleaning, to remove particles on the silicon wafer, and oxidize and remove a small amount of organic matter and metal atom contaminants such as Au, Ag, Cu, Ni, and Cd, Zn, Ca, and Cr on the surface. Water cleaning was then carried out to remove residual chemicals. Next, alkaline polishing treatment was performed, using an alkaline polishing solution containing 5.97% wt KOH, at a temperature of 80° C., for an alkaline polishing treatment time of 300 s, to remove the damage and polish the silicon wafer. Then SC1 cleaning, ozone cleaning, and final acid cleaning and dewatering were performed, to complete the polishing and cleaning.

3) The polished silica wafer was fed into a low-pressure vapor deposition (LPCVD) apparatus, and 1.4 nm-thick tunnel $SiO_2$ and 50 nm-thick intrinsic polycrystalline silicon poly Si were obtained after deposition.

4) The intermediate after the polycrystalline silicon (poly) layer was deposited was placed in a tubular diffusion furnace, phosphorus oxychloride was introduced, and phosphorus doping of the poly Si region and crystallization of poly were completed at 870° C., where the doping concentration was 5E20 cm−3. In this process, a PSG layer with a thickness of about 30 nm was formed.

5) A SiNx monolayer film with a thickness of 80 nm and a refractive index of 2.4% was deposited on the surface of the N-type doped crystalline silicon layer n-poly-Si by PECVD, and the SiNx monolayer film was used as a mask layer.

6) The SiNx film in the P region was cut by using 532 nm green nanosecond laser at a power of 15 W, to expose the back surface of the silicon wafer.

7) The laser treated silicon wafer was placed in a texturing machine. The working volume of the tank of the machine was 360 L. The main processes and functions were as follows: 1% wt HF at 25° C. was used in a first functional tank to remove the residue. The cleaned silicon wafer was fed to a next texturing tank. The texturing solution was 3.29% wt KOH solution, the texturing temperature was 82° C., and the texturing time was 570 s. Thus, the texturing treatment of the front and back laser-treated regions was completed. Then efficient SC1 cleaning was performed, using a cleaning solution of $NH_4OH$—$H_2O_2$-$H_2O$, at a volume ratio of 1:1:5, the cleaning temperature was 65° C., and the cleaning time was 300 s. The pyramid was smoothed using 50 ppm O3 water containing HF, where the concentration of hydrofluoric acid was 0.31% wt. SC2 cleaning was performed to remove metal residues. The cleaning solution was HCL-$H_2O_2$-$H_2O$ at a volume ratio of 1:1:5, the cleaning temperature was 65° C., and the cleaning time was 200 s. Finally, cleaning with 5% wt hydrofluoric acid was carried out to complete the texturing.

8) A 7 nm-thick a-si:H (that is, first intrinsic non-crystalline silicon layer i-a-Si) and a 15 nm-thick a-si:H(P) (that is, P-type doped non-crystalline silicon layer p-a-Si) were sequentially deposited on the back surface by CVD at 250° C., and 12 nm-thick a-si:H and 160 nm-thick SiNx were deposited on the front surface after the silica wafer was turned over, where the SiNx sacrificial layer was 80 nm, and the refractive index of the SiNx sacrificial layer was 2.4%.

9) One end of the P-type doped non-crystalline silicon layer p-a-Si away from the P doped region was cut by using a nanosecond laser, to expose the SiNx mask layer.

10) The exposed SiNx mask layer in Step 9) was cleaned with 8% wt hydrofluoric acid, to remove the SiNx mask layer and PSG layer in the grooved region, and expose the remaining part of the N-type doped crystalline silicon layer n-poly-Si. Meanwhile, after treatment with hydrofluoric acid, the SiNx sacrificial layer on the front surface was removed, where the thickness of the front SiNx was 80 nm.

11) An indium-tin oxide (ITO) layer was deposited on the back surface, where the thickness was 50 nm.

12) A groove was formed using ultraviolet picosecond laser, to expose the SiNx mask layer and form an isolating groove, which insulate the N region and P region, to prevent electric leakage caused by the interconnection of the N/P region. The insulating resistance of the insulated area was tested to be >2 MΩ, and the laser width was 100 µm.

13) A metallized electrode was prepared on the back surface by screen printing using metallic silver, to complete the preparation of a metallized electrode on the back surface.

Example 10

A solar cell was provided in this example. This example had the following differences from Example 9.

3) The polished silica wafer was fed into a low-pressure vapor deposition (LPCVD) apparatus, and 1.4 nm-thick tunnel SiO2 and 70 nm-thick intrinsic polycrystalline silicon poly Si were obtained after deposition at a temperature of 640° C.

The other steps were the same as those in Example 9.

Example 11

A solar cell was provided in this example. This example had the following differences from Example 9.

3) The polished silica wafer was fed into a low-pressure vapor deposition (LPCVD) apparatus, and 1.4 nm-thick tunnel SiO2 and 90 nm-thick intrinsic polycrystalline silicon poly Si were obtained after deposition at a temperature of 640° C.

The other steps were the same as those in Example 9.

Example 12

A solar cell was provided in this example. This example had the following differences from Example 9.

6) The SiNx film in the P region was cut by using 532 nm green nanosecond laser at a power of 12 W, to expose the back surface of the silicon wafer.

Example 13

A solar cell was provided in this example. This example had the following differences from Example 9.

6) The SiNx film in the P region was cut by using 532 nm green nanosecond laser at a power of 10 W, to expose the back surface of the silicon wafer.

Example 14

A solar cell was provided in this example. This example had the following differences from Example 9.

6) The SiNx film in the P region was cut by using 532 nm green nanosecond laser at a power of 8 W, to expose the back surface of the silicon wafer.

Example 15

A solar cell was provided in this example. This example had the following differences from Example 9.

6) The SiNx film in the P region was cut by using 532 nm green nanosecond laser at a power of 6 W, to expose the back surface of the silicon wafer.

Comparative Example 6

An HBC solar cell was provided in this comparative example, which was prepared through a process comprising the following steps:

1) An N-type silica wafer of 1.3 Ωcm and 166*166 and having a thickness of 165 µm was provided.

2) Polishing and cleaning: The silicon wafer was placed in a tank-type alkaline polishing machine for polishing and cleaning. The working volume of the tank body of the cleaning machine was 360 L. The silicon wafer was pre-cleaned, to remove organic and other contaminants generated during the cutting and transportation of the silicon wafer. In this example, a standard RCA cleaning solution was used for cleaning, to remove particles on the silicon wafer, and oxidize and remove a small amount of organic matter and metal atom contaminants such as Au, Ag, Cu, Ni, and Cd, Zn, Ca, and Cr on the surface. Water cleaning was then carried out to remove residual chemicals. Next, alkaline polishing treatment was performed, using an alkaline polishing solution containing 5.97% wt KOH, at a temperature of 80° C., for an alkaline polishing treatment time of 300 s, to remove the damage and polish the silicon wafer. Then SC1 cleaning, ozone cleaning, and final acid cleaning and dewatering were performed, to complete the polishing and cleaning.

3) A layer of SiNx mask was deposited on the back surface of the silicon wafer by PECVD, where the thickness was 200 nm, and the refractive index was 2.4%.

4) In a tank-type cleaning machine, the silicon wafer was placed in an HF tank containing a 1% wt HF solution, and treated for 30 s at normal temperature, to remove the SiNx plated on the side and front surface of the solar cell. Then the silicon wafer was textured in an alkaline tank, where the texturing solution was a solution containing 2.5% wt KOH+texturing additives, the texturing temperature was 82° C., and the texturing time was 780 s. Next, the textured surface was smoothed in a HNO3/HF tank containing a solution of HNO3 and HF at a volume ratio of 1:100, where the total etching amount was 1.8 g. The front surface is caused to have a reflectivity of 12% and a large microscopic texture structure in which the textured pyramid has a size of 4 µm. Finally, the silica wafer was treated in an 8% wt HF tank at room temperature for 300 s, to remove the SiNx mask remaining on the back surface completely.

5) 15 nm-thick intrinsic a-si:H, 25 nm-thick phosphorus-doped a-si:H(N), 200 nm-thick SiNx layer and 15 nm-thick intrinsic a-si:H were sequentially deposited on the back surface of the silicon wafer by CVD.

6) The outermost intrinsic a-si:H on the back surface was grooved by using 532 nm laser at a power of 6 W, to expose a P+ region, which was a region for depositing intrinsic a-si:H and a-si:H(P) in subsequent steps. The grooved P+ region, and the non-grooved N+ region had the same width in the direction of arrangement.

7) In a tank-type cleaning machine, the silicon wafer was placed in an HF tank containing a 8% wt HF solution, and treated for 200 s, to remove SiNx from the region grooved by laser. Then the silicon wafer was etched in an alkaline tank, where the solution was 0.5 wt % KOH+0.15 wt % H2O2, the solution temperature was 25° C., and the etching time was 400 s, to remove the remaining intrinsic a-si:H and phosphorus-doped a-si:H(N) layer.

8) 15 nm-thick intrinsic a-si:H and 25 nm-thick B-doped a-si:H(P) were sequentially doped on the back surface of the silicon wafer by CVD.

9) 15 nm-thick intrinsic a-si:H and 85 nm-thick SiNx layer were sequentially deposited on the front surface of the silicon wafer by CVD.

10) The intrinsic a-si:H and a-si:H(P) in an N+ region on the back surface was etched by laser.

11) The SiNx layer exposed in the N+ region after laser treatment was removed using an HF solution having a concentration of 8% wt, for a period of time of 400 s, to expose the phosphorus-doped a-si:H(N) layer.

12) An indium-tin oxide (ITO) layer was deposited on the back surface, where the thickness was 80 nm.

13) A groove was formed using a 355 nm purple picosecond laser, to expose the SiNx mask layer and form an isolating groove, which insulate the N region and P region, to prevent electric leakage caused by the interconnection of the N/P region. The insulating resistance of the insulated area was tested to be >10 MΩ, and the laser width was 100 μm.

14) A metallized electrode was prepared on the back surface by screen printing using metallic silver, solidified, and annealed.

Comparative Example 7

Comparative Example 7 had the following differences from Example 6.

6) The outermost intrinsic a-si:H on the back surface was grooved by using 532 nm laser at a power of 8 W, to expose a P+ region, which was a region for depositing intrinsic a-si:H and a-si:H(P) in subsequent steps.

Comparative Example 8

Comparative Example 8 had the following differences from Example 6.

6) The outermost intrinsic a-si:H on the back surface was grooved by using 532 nm laser at a power of 10 W, to expose a P+ region, which was a region for depositing intrinsic a-si:H and a-si:H(P) in subsequent steps.

Comparative Example 9

Comparative Example 9 had the following differences from Example 6.

6) The outermost intrinsic a-si:H on the back surface was grooved by using 532 nm laser at a power of 12 W, to expose a P+ region, which was a region for depositing intrinsic a-si:H and a-si:H(P) in subsequent steps.

The energy conversion efficiency Eta, the open-circuit voltage Uoc (V), the short-circuit current Isc (A), the filling factor FF (%), and the series resistance Rsh (Ω) of the solar cells prepared in Examples 9-11 and Comparative Example 6 were tested. The results are shown in Table 2.

TABLE 2

| | Eta (%) | Uoc (V) | Isc (A) | FF (%) | RS (Ω) | Laser powder in P region (w) |
|---|---|---|---|---|---|---|
| Example 9 | 26.43 | 0.747 | 11.63 | 83.78 | 1.21 | 15 |
| Example 10 | 26.45 | 0.748 | 11.61 | 83.85 | 1.20 | 15 |
| Example 11 | 26.39 | 0.748 | 11.58 | 83.90 | 1.25 | 15 |
| Example 12 | 26.23 | 0.745 | 11.52 | 83.88 | 1.26 | 12 |
| Example 13 | 26.28 | 0.743 | 11.62 | 83.85 | 1.24 | 10 |
| Example 14 | 26.32 | 0.745 | 11.60 | 83.82 | 1.31 | 8 |
| Example 15 | 26.30 | 0.744 | 11.59 | 83.88 | 1.27 | 6 |
| Comparative Example 6 | 26.14 | 0.740 | 11.60 | 83.50 | 1.38 | 6 |
| Comparative Example 7 | 26.12 | 0.739 | 11.59 | 83.50 | 1.36 | 8 |
| Comparative Example 8 | 25.20 | 0.720 | 11.15 | 81.20 | 1.45 | 10 |
| Comparative Example 9 | 25.12 | 0.718 | 11.13 | 81.18 | 1.65 | 12 |

It can be seen that patternization is achieved by performing masking and demasking techniques for many times in Comparative Examples 6-9, so the production cost is high, and the process control difficulty is high. A tunnel SiO2 layer+N-type crystalline silicon layer n-poly-Si passivated contact is used in Examples 9-15 to replace an intrinsic a-si:H+a-si:H(N) film for passivation in Comparative Examples 6-9. Since the tunnel SiO2 layer+N-type crystalline silicon layer n-poly-Si in Examples 9-15 is less sensitive to laser-induced thermal damage, in this step, a laser cutting process can be directly performed, without patternization by performing masking and demasking techniques for many times. Particularly, a higher efficiency is achieved at a lower laser power in Comparative Examples 6-7. However, at a higher laser power, obvious reduction in efficiency is shown in Comparative examples 8-9. It can be seen that the tunnel SiO2 layer+N-type crystalline silicon layer n-poly-Si is less sensitive to laser-induced thermal damage, so the impact on the passivation effect of a doped region corresponding to the first region can be reduced during laser cutting process. Examples 9-15 all have high efficiency at a laser power of 6-15 W. It can be seen that the preparation process window of the present application is broad. As can be further seen from Table 2, compared with Comparative Examples 6-7, the energy conversion efficiency Eta, the open-circuit voltage Uoc, and the filling factor FF of the solar cells in Examples 9-15 reach levels comparable to those in Comparative Examples 6-7.

In the description of the specification, the description with reference to the terms "an embodiment", "some embodiments", "example", "specific example", or "some examples" and so on means that a specific feature, structure, materials or characteristics described in connection with the embodiment or example are embraced in at least one embodiment or example of the present disclosure. In the specification, the schematic expressions of the above terms do not necessarily refer to the same embodiment or example. In addition, the described specific features, structure, materials or characteristics may be combined in any suitable manners in one or more embodiments. Additionally, where there are no contradictions, the various embodiments or examples described in the specification and features of various embodiments or examples can be combined by those skilled in the art.

Although embodiments of the present application have been shown and described above, it can be understood that the foregoing embodiments are exemplary and cannot be understood as a restriction on the present application, and changes, modifications, replacements, and variations can be made to the foregoing embodiments by a person of ordinary skill in the art without departing from the scope of the present application.

The invention claimed is:

1. A back-contact solar cell, comprising:
a semiconductor substrate, wherein the semiconductor substrate has a first surface and a second surface opposite to each other, wherein the first surface comprises recessed regions and non-recessed regions that are alternatively arranged with each other, wherein the recessed regions comprises a textured surface, and the non-recessed regions comprises a polished surface comprising square blocks, wherein an interface between the recessed regions and the non-recessed regions is oblique;
a tunnel oxide layer and an N-type doped crystalline silicon layer, wherein the tunnel oxide layer is located on the non-recessed regions, and the N-type doped crystalline silicon layer is located on a surface of the tunnel oxide layer away from the semiconductor substrate;
a first intrinsic non-crystalline silicon layer and a P-type doped non-crystalline silicon layer, wherein the N-type doped crystalline silicon layer and the P-type doped non-crystalline silicon layer have opposite conductivity types, wherein the first intrinsic non-crystalline silicon layer is located on the recessed regions and extends on part of a surface of the N-type doped crystalline silicon layer away from the tunnel oxide layer, and the P-type doped non-crystalline silicon layer is located on a surface of the first intrinsic non-crystalline silicon layer away from the semiconductor substrate, wherein a staggered-lamination region is formed based on the first intrinsic non-crystalline silicon layer, the P-type doped non-crystalline silicon layer, the tunnel oxide layer and the N-type doped crystalline silicon layer; and
an isolating structure, wherein the isolating structure comprises an isolating layer and an isolating groove, wherein the isolating layer is located between the first intrinsic non-crystalline silicon layer and the N-type doped crystalline silicon layer in the staggered-lamination region, and wherein the isolating groove penetrates through the P-type doped non-crystalline silicon layer and the first intrinsic non-crystalline silicon layer in the staggered-lamination region.

2. The back-contact solar cell according to claim 1, wherein the back-contact solar cell further comprises a first electrode layer and a second electrode layer, wherein the first electrode layer is located at one side of the isolating groove, and the first electrode layer covers the P-type doped non-crystalline silicon layer, and wherein the second electrode layer is located at the other side of the isolating groove, and the second electrode layer covers the P-type doped non-crystalline silicon layer and the N-type doped crystalline silicon layer.

3. The back-contact solar cell according to claim 2, wherein the first electrode layer and the second electrode layer are transparent electrode layers, wherein the first electrode layer and the second electrode layer each independently comprise at least one material selected from indium-tin oxide, aluminum zinc oxide, hydrogen doped indium oxide, and indium-tungsten oxide.

4. The back-contact solar cell according to claim 1, wherein the isolating layer comprises an insulating layer, and the insulating layer is located between the first intrinsic non-crystalline silicon layer and the N-type doped crystalline silicon layer; or
the isolating layer comprises a silicon nitride layer and a phosphosilicate glass (PSG) layer, wherein the PSG layer is located on the surface of the N-type doped crystalline silicon layer away from the tunnel oxide layer, and the silicon nitride layer is located on a surface of the PSG layer away from the N-type doped crystalline silicon layer.

5. The back-contact solar cell according to claim 1, further comprising a passivation layer,
wherein the passivation layer comprises a second intrinsic non-crystalline silicon layer and a silicon nitride passivation layer, the second intrinsic non-crystalline silicon layer is provided on the second surface, and the silicon nitride passivation layer is provided on a surface of the second intrinsic non-crystalline silicon layer away from the semiconductor substrate.

6. The back-contact solar cell according to claim 1, wherein
the tunnel oxide layer is a tunnel $SiO_2$ layer; and/or
the tunnel oxide layer has a thickness of 1 to 4 nm; and/or
the N-type doped crystalline silicon layer has a thickness of 30 to 250 nm; and/or
a doping concentration of phosphorus in the N-type doped crystalline silicon layer is 8E19 to 5E20 $cm^{-3}$; and/or
the first intrinsic non-crystalline silicon layer has a thickness of 10 to 20 nm; and/or
the P-type doped non-crystalline silicon layer has a thickness of 5 to 45 nm; and/or
a doping concentration of boron in the P-type doped non-crystalline silicon layer is 10e20 $cm^{-3}$ to 10e21 $cm^{-3}$.

7. The back-contact solar cell according to claim 1, wherein:
the second surface has a textured structure; and/or
an edge of the recessed region in contact with the non-recessed region is oblique.

8. The back-contact solar cell according to claim 4, wherein the silicon nitride layer has a thickness of 50 to 110 nm; and/or
the PSG layer has a thickness of 25 to 35 nm.

9. The back-contact solar cell according to claim 1, wherein the semiconductor substrate is an N-type semiconductor substrate, and the recessed region has a size in a width direction that is greater than a size of the non-recessed region in the width direction; or
the semiconductor substrate is a P-type semiconductor substrate, and the recessed region has a size in a width direction that is less than a size of the non-recessed region in the width direction.

10. The back-contact solar cell according to claim 1, wherein:
the tunnel oxide layer has a thickness of 1 to 1.8 nm; and/or
the N-type doped crystalline silicon layer has a thickness of 40 to 200 nm; and/or
a doping concentration of phosphorus in the N-type doped crystalline silicon layer is 3E20 $cm^{-3}$ to 9E20 $cm^{-3}$; and/or
the P-type doped non-crystalline silicon layer has a thickness of 10 to 20 nm.

11. A method for preparing a back-contact solar cell, comprising:
providing a semiconductor substrate, wherein the semiconductor substrate has a first surface and a second surface opposite to each other, and the first surface comprises first regions and second regions that are alternatively arranged with each other, wherein first regions are polished regions comprising square blocks;

forming a tunnel oxide layer, a N-type doped crystalline silicon layer, and an isolating layer sequentially on the first surface;

cutting the isolating layer in the second region by laser, to expose the semiconductor substrate in the second region, wherein the tunnel oxide layer and the N-type doped crystalline silicon layer in the first region are preserved;

forming a first intrinsic non-crystalline silicon layer and a P-type doped non-crystalline silicon layer sequentially;

removing parts of the first intrinsic non-crystalline silicon layer, the P-type doped non-crystalline silicon layer and the isolating layer on the first region, wherein remaining parts of the first intrinsic non-crystalline silicon layer and the P-type doped non-crystalline silicon layer staggered with the tunnel oxide layer and the N-type doped crystalline silicon layer to form a staggered-lamination region; and forming an isolation groove in the staggered-lamination region, wherein the isolating groove penetrates through the P-type doped non-crystalline silicon layer and the first intrinsic non-crystalline silicon layer in the staggered-lamination region to divide the staggered-lamination region into a first staggered-lamination region and a second staggered-lamination region.

12. The method according to claim 11, further comprising:

performing alkaline texturing on the semiconductor substrate after the second region is exposed, to form a pyramidal texture structure on the second surface and in the second region.

13. The method according to claim 12, wherein after the pyramidal texture structure is formed on the second surface and in the second region, a second intrinsic non-crystalline silicon layer and a silicon nitride passivation layer are sequentially formed on the second surface.

14. The method according to claim 11, wherein after the isolation groove is formed in the staggered-lamination region, a first electrode layer is formed at one side of the isolating groove, and the first electrode layer covers the P-type doped non-crystalline silicon layer; and a second electrode layer is formed at the other side of the isolating groove, and the second electrode layer covers the P-type doped non-crystalline silicon layer and the N-type doped crystalline silicon layer.

15. The method according to claim 14, comprising:

forming a first grid line on part of a surface of the first electrode layer; and forming a second grid line on part of a surface of the second electrode layer.

16. The method according to claim 11, wherein the tunnel oxide layer and the N-type doped crystalline silicon layer are deposited by LPCVD.

17. The method according to claim 11, wherein the isolating layer comprises an insulating layer; or the isolating layer comprises the isolating layer comprises a silicon nitride layer and a phosphosilicate glass (PSG) layer, wherein the PSG layer is located on a surface of the N-type doped crystalline silicon layer away from the tunnel oxide layer, and the silicon nitride layer is located on a surface of the PSG layer away from the N-type doped crystalline silicon layer.

18. The method according to claim 11, wherein parts of the first intrinsic non-crystalline silicon layer and the P-type doped non-crystalline silicon layer on the first region are removed by laser, at a power of 6-15 W.

* * * * *